United States Patent [19]
Fujioka et al.

[11] Patent Number: 5,631,547
[45] Date of Patent: May 20, 1997

[54] POWER-SUPPLY-VOLTAGE REDUCTION DEVICE, SEMICONDUCTOR INTEGRATED CIRCUIT DEVICE INCLUDING THE REDUCTION DEVICE AND METHOD OF PRODUCING ELECTRONIC DEVICE INCLUDING SUCH DEVICES

[75] Inventors: Shin-ya Fujioka; Masao Taguchi, both of Kawasaki, Japan

[73] Assignee: Fujitsu Limited, Kawasaki, Japan

[21] Appl. No.: 377,588

[22] Filed: Jan. 24, 1995

[30] Foreign Application Priority Data

Jan. 26, 1994 [JP] Japan ................................. 6-007074

[51] Int. Cl.$^6$ ............................................. H01L 21/00
[52] U.S. Cl. ............................................. 323/273
[58] Field of Search ...................... 437/7, 974, 62, 437/238, 241, 907, DIG. 135, 66; 430/313, 30, 311, 394, 396; 323/273

[56] References Cited

U.S. PATENT DOCUMENTS 5,354,695 10/1994 Leedy ................................ 437/7
5,451,489 9/1995 Leedy ................................ 430/313
5,451,534 9/1995 Yang ................................. 437/52

*Primary Examiner*—Aditya Krishnan
*Attorney, Agent, or Firm*—Armstrong, Westerman, Hattori, McLeland & Naughton

[57] ABSTRACT

A power-supply-voltage reduction device including a voltage reduction circuit which has a plurality of transistors and a voltage control circuit. The plurality of transistors have first current electrodes to be supplied with an external power supply voltage, control electrodes receiving a control signal and second current electrodes which are connected together to an output port, the second current electrodes producing a reduced power supply voltage which is generated from the external power supply voltage according to the control signal, at the output port. The voltage control circuit generates the control signal based on a comparison of the reduced power supply voltage and a reference voltage, and controls at least one of the plurality of transistors so as to maintain the reduced power supply voltage substantially to a level of the reference voltage. Since this power-supply-voltage reduction device is constructed with the plurality of transistors for a low external power supply voltage, this device may have a sufficient current supply ability to achieve a stable operating speed and a stable reduced supply voltage.

21 Claims, 29 Drawing Sheets

SOURCE-DRAIN VOLTAGE (VCC=5V)

FIG.14
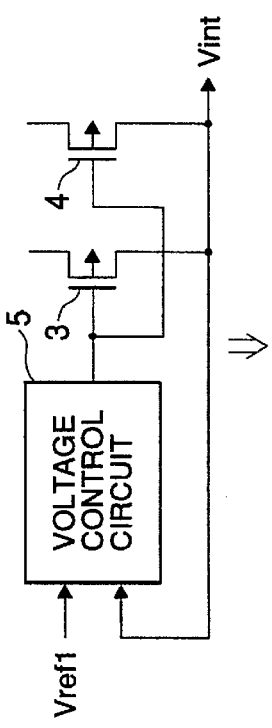
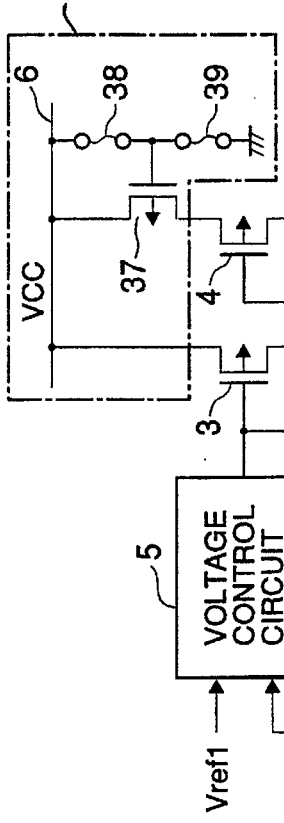
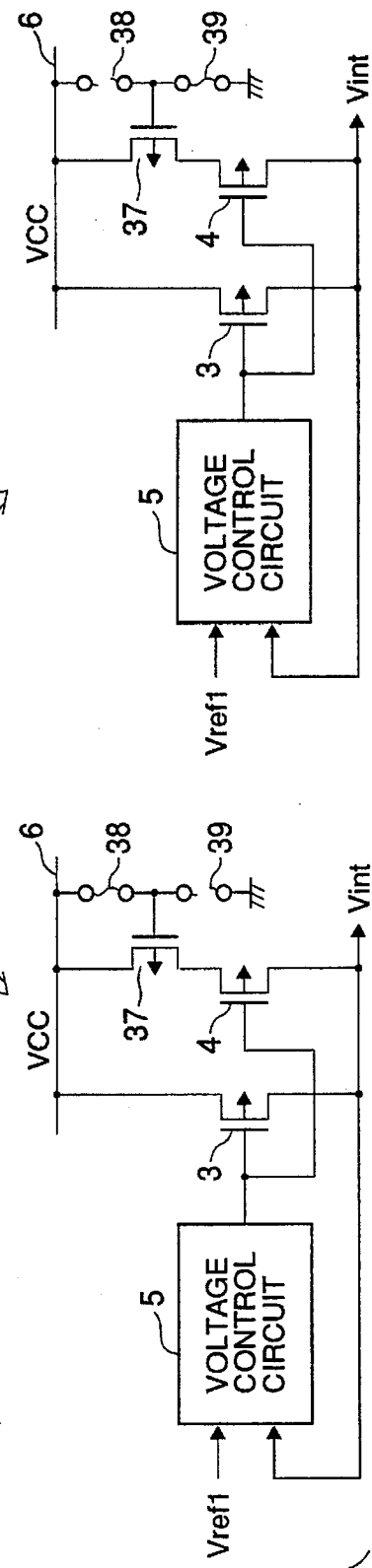
STEP(a) & (b)
STEP(c)

FABRICATION STEP OF A TRANSISTOR CONTROL CIRCUIT

FIG.16
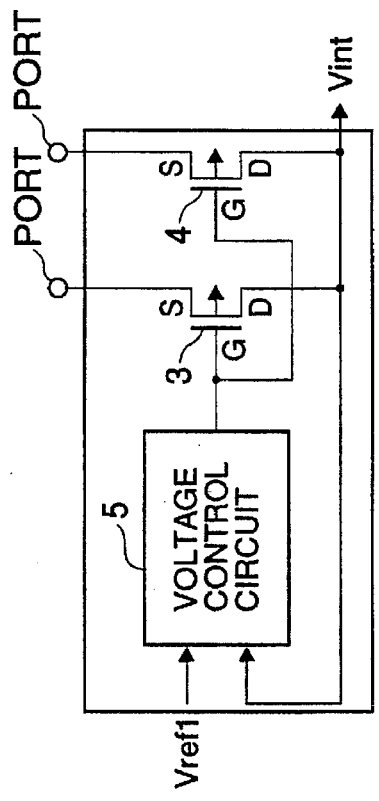
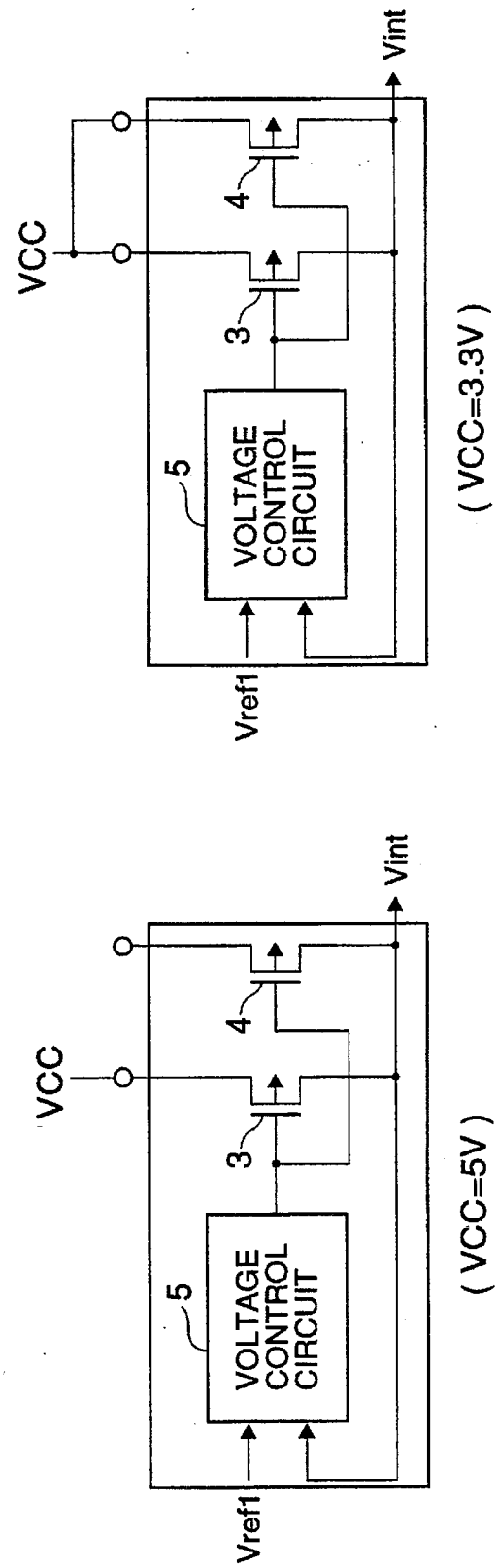
EXAMPLES FOR USE (VCC=5V)

FIG. 21 (VCC=3v)

FIG. 24 (VCC=5V)

(VCC=3V)

POWER-SUPPLY-VOLTAGE REDUCTION DEVICE, SEMICONDUCTOR INTEGRATED CIRCUIT DEVICE INCLUDING THE REDUCTION DEVICE AND METHOD OF PRODUCING ELECTRONIC DEVICE INCLUDING SUCH DEVICES

BACKGROUND OF THE INVENTION

1. Field of the Invention

The present invention generally relates to a power-supply-voltage reduction device and a semiconductor integrated circuit device including the device, and more particularly, to a power-supply-voltage reduction device which reduces an external power supply voltage supplied from the outside to a lower voltage suitable for circuits operable with a lower power supply voltage, and to a semiconductor integrated circuit device including the reduction device, where the reduced power supply voltage is supplied to a variety of circuits formed inside the semiconductor integrated device.

The present invention also relates to a method for fabricating an electronic device including such a power-supply-voltage reduction device, which is arranged based on an external power supply voltage.

2. Description of the Related Art

In a metal oxide semiconductor (MOS) memory such as a dynamic random-access memory (DRAM) and a static random-access memory (SRAM), a structure of an MOS transistor to be integrated has been finely structured in order to improve a density of an integrated circuit.

Along with the fine structuring of the MOS transistor, a gate-insulated film of the MOS transistor has been structured in the form of a thin film. Therefore, for mitigating an electric field applied across the gate-insulated film, and ensuring device quality, there is a need for reducing a power supply voltage.

In addition, in order to perform the fine structuring of the MOS transistor, a channel length of the MOS transistor is shortened, so that a short-channel effect appears, and the above may cause an abnormal threshold voltage in the MOS transistor. From this point, there is an additional need for reducing the power supply voltage.

Since there exist a variety of semiconductor integrated circuits which do not require a reduction of the power supply voltage surrounding the MOS transistor, it is desirable to realize a power-supply-voltage reduction device inside the MOS memory.

By realizing the power-supply-voltage reduction device inside the semiconductor integrated circuit, besides the advantages of ensuring the quality and mitigating the short-channel effect, another advantage of reducing a power consumption can be obtained, because of the power supply voltage being lower than an external power supply voltage.

And further, if the power-supply-voltage reduction circuit is constructed with a constant voltage circuit, since the power supply voltage which is supplied to internal circuits is maintained constantly regardless of changes in the external power supply voltage, there is another advantage in that a fluctuation of performance of the internal circuits due to the external supply voltage being fluctuated is removed.

FIG. 1 shows a schematic diagram of a conventional power-supply-voltage reduction device which is formed inside the DRAM. In FIG. 1, the power-supply-voltage reduction device is constructed with an enhancement-type pMOS transistor 1 for a regulator transistor, and a differential amplifier 2 controlling a gate voltage of the pMOS transistor 1.

In FIG. 1, VCC is an external power supply voltage which is supplied from the outside, Vref is a reference voltage which is generated inside the memory, and Vint is a reduced supply voltage which is supplied to given circuits in the memory.

In the power-supply-voltage reduction device, the reference voltage Vref is applied to a standard phase signal input port of the differential amplifier 2, and the reduced supply voltage Vint is applied to the reversed phase signal input port thereof, so that the reduced supply voltage Vint is controlled to be substantially maintained to the reference voltage Vref.

Recently, a DRAM system operable with the external power supply voltage of 3 to 3.3 V has been developed instead of a system operable with the voltage of 5 V.

For dealing with the new DRAM system, two methods of a power-supply-voltage construction have been implemented.

A first method is such that, in the case of the external power supply voltage VCC of 5 V, the reduced supply voltage of 3 to 3.3 V is generated through the power-supply-voltage reduction device, and in the case of the external power supply voltage VCC of 3 to 3.3 V, the external power supply is directly produced without a reduction operation of the external power supply voltage, by means of deactivating the pMOS transistor 1 by a metal option or a fuse option.

A second method is that, by setting the reference voltage Vref to less than 3 V, in the instance of not only the external power supply voltage VCC of 5 V, but also that of 3 to 3.3 V, the reduced supply voltage is generated by reducing the external power supply voltage VCC.

However, in the first method, when the external power supply voltage of 3 to 3.3 V is directly produced without the reduction operation, a supplied voltage to the internal circuits has a voltage range of 2.7 to 3.6 V for a margin of 10%. Therefore, the internal circuits are operative with such a voltage range, there is thus a problem of a fluctuation of operating speed and power consumption which depend on the power supply voltage.

On the other hand, in the second method, since the reduced supply voltage is generated by reducing the external power supply voltage VCC of 5 V or 3 to 3.3 V, the fluctuation of the operating speed and the power consumption may be suppressed. However, in this case, another problem occurs, which will be described in the following.

FIG. 2 shows a graphical representation of a static performance of the pMOS transistor 1. A horizontal axis is a source-drain voltage, and a vertical axis is a drain current. In this figure, the reduced supply voltage is set to 3.0 V. Therefore, when the external power supply voltage of 5 V or 3.3 V is supplied to a drain of the pMOS transistor 1, the source-drain voltage becomes respectively 2 V or 0.3 V. As shown in FIG. 2, in a case of the external power supply voltage of 3 to 3.3 V, the drain current for the source-drain voltage of 0.3 V is extremely degraded against that for the source-drain voltage of 2 V, so that there is a problem of degradation of the operating speed and a large fluctuation of the reduced supply voltage supplied to the internal circuits.

To produce a substantial current supply ability for a low external power supply voltage such as 3 to 3.3 V in order to solve this problem, it is required to fabricate a power-supply-voltage reduction device only suitable for the low external power supply voltage. However, since it is difficult to predict a demand for such a power-supply-voltage reduction device suitable for the low external power supply voltage, it is not efficient to fabricate a variety of reduction devices for different external power supply voltages using respective processes.

SUMMARY OF THE INVENTION

It is an object of this invention to provide a power-supply-voltage reduction device, which is capable of producing a sufficient current supply ability to achieve a stable operating speed and a stable reduced power supply voltage for each of different external power supply voltages, in which the disadvantages described above are eliminated.

A more specific object of the present invention is to provide a semiconductor integrated circuit device including such a power-supply-voltage reduction device, which is applicable for semiconductor integrated circuit systems having different power supply voltages.

A still more specific object of the present invention is to provide a method of producing an electronic device including the power-supply-voltage reduction device, which selectively fabricates the power-supply-voltage reduction device that is operable with the different external power supply voltage and has current supply ability to achieve the stable operating speed and the stable reduced supply voltage.

The object described above is achieved by a method for producing the electronic device including the power-supply-voltage reduction device arranged based on the external power supply voltage comprising the steps of: (a) forming a plurality of transistors having first current electrodes to be supplied with the external power supply voltage, control electrodes receiving a control signal, and second current electrodes which are connected to an output port together, the second current electrodes producing a reduced power supply voltage which is generated from the external power supply voltage according to the control signal, at the output port; (b) forming a voltage control circuit generating the control signal based on a comparison of the reduced power supply voltage and a reference voltage and controlling at least one of the plurality of transistors so as to maintain the reduced power supply voltage substantially to a level of the reference voltage; and (c) forming a transistor control circuit so as to activate at least one of the plurality of transistors according to a level of the external power supply voltage to be supplied to a power supply line.

The object described above is also achieved by the method as mentioned above, wherein the step (c), when forming first and second transistors in the step (a), forms the transistor control circuit, so as to activate the first transistor and to deactivate the second transistor in a case that the external power supply voltage of a first voltage level will be supplied to the power supply line, or so as to activate both the first and second transistors in a case that the external power supply voltage of a second voltage level less than the first voltage level will be supplied thereto.

According to the method of the power-supply-voltage reduction device, the steps of forming the plurality of transistors and forming the voltage control circuit are common to a variety of voltage reduction devices with different external power supply voltages. Only in the step of forming the transistor control circuit is an activation/deactivation of the transistors controlled to form the voltage reduction device for each external power supply voltage.

Therefore, such an activation/deactivation in the transistor control circuit makes it possible to selectively fabricate the voltage reduction device for a specific external power supply voltage. Further, since the voltage reduction device is constructed with a plurality of transistors for a low external power supply voltage, this voltage reduction device may have the sufficient current supply ability to achieve the stable operating speed and the stable reduced supply voltage.

When the plurality of transistors includes the first and the second transistors, if a channel construction of the first transistor is associated with that of the second transistor by a given relationship, a combination of the first and the second transistors with the external power supply voltage of the second voltage level less than the first voltage level may have the substantially same current supply ability as the first transistor with the external power supply voltage of the first voltage level.

The object described above is further achieved by a power-supply-voltage reduction device comprising a voltage reduction circuit, which includes: a plurality of transistors having first current electrodes to be supplied with an external power supply voltage, control electrodes receiving a control signal, and second current electrodes, which are connected to an output port together, producing a reduced power supply voltage, which is generated from the external power supply voltage according to the control signal, at the output port; and a voltage control circuit generating the control signal based on a comparison of the reduced power supply voltage and a reference voltage, and controlling at least one of the plurality of transistors so as to maintain the reduced power supply voltage substantially to a level of the reference voltage.

The object described above is also achieved by the power-supply-voltage reduction device as mentioned above, further comprising a transistor control circuit for activating at least one of the plurality of transistors by a user according to a level of the external power supply voltage to be supplied to a power supply line.

In addition, the object described above is achieved by the power-supply-voltage reduction device as mentioned above, comprising a voltage-reduction-circuit control circuit discriminating the voltage level of the external power supply voltage which is supplied to the power supply line, and controlling the voltage reduction circuit to activate an associated number of the transistors according to the voltage level of the external power supply voltage.

According to the power-supply-voltage reduction device, in the transistor control circuit, the activation/deactivation of the transistors reducing the external power supply voltage is controlled by the user, and in the voltage-reduction-circuit control circuit, the activation/deactivation of the transistors is automatically controlled according to the voltage level of the external power supply voltage. In such control operations, a large number of transistors are activated to produce a large current supply for the low external power supply voltage. On the other hand, for a high external power supply voltage, a small number of transistors are activated because of producing the sufficient current supply.

Therefore, the power-supply-voltage reduction device is applicable for a variety of systems with different external power supply voltages, and is capable of producing the sufficient current supply ability for any external power supply voltage. Thus, this substantial current supply ability enables the power-supply-voltage reduction device to achieve the stable operating speed and the stable reduced supply voltage.

The semiconductor integrated circuit including such the power-supply-voltage reduction device, is applicable for semiconductor integrated systems with different power supply voltages.

Other objects and further features of the present invention will be apparent from the following detailed description when read in conjunction with the accompanying drawings.

BRIEF DESCRIPTION OF THE DRAWINGS

FIG. 14 shows fabricating steps of the selective fabrication method of a third embodiment according to the present invention;

FIG. 16 shows a schematic diagram of a first embodiment of the power-supply-voltage reduction device for a user selection according to the present invention and its examples for use;

DESCRIPTION OF THE PREFERRED EMBODIMENTS

In the following, descriptions will be sequentially given of methods of producing a power-supply-voltage reduction device, the power-supply-voltage reduction device, and a semiconductor integrated circuit including the power-supply-voltage reduction device, with reference to FIGS. 3 to 15, FIGS. 16 to 28, and FIG. 29, respectively. In these descriptions, examples of the devices applicable to a DRAM are represented.

Figure 1:
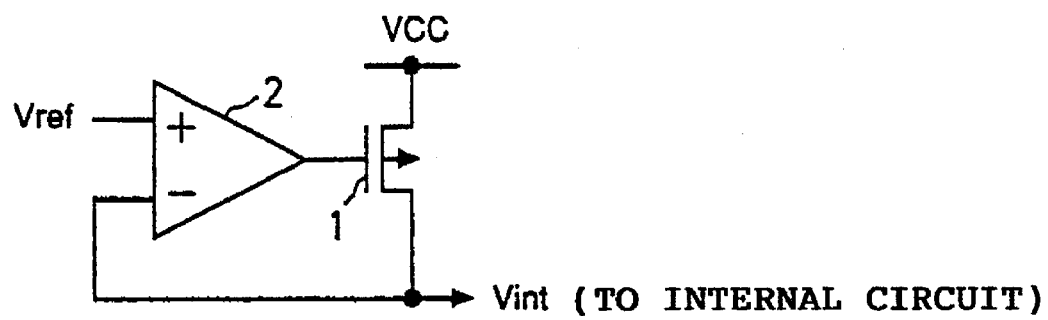
FIG. 1 shows a schematic diagram of a conventional power-supply-voltage reduction device which is formed inside a DRAM.
Figure 2:
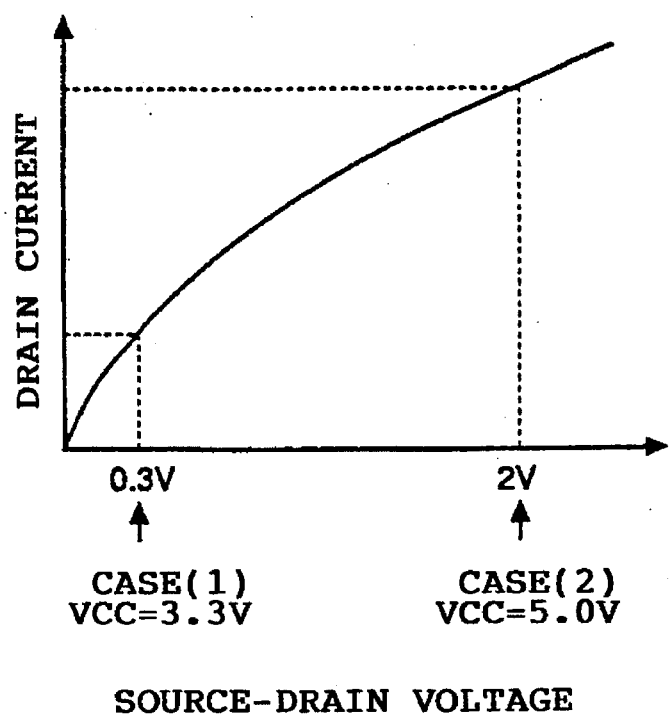
FIG. 2 shows a graphical representation of a static performance of a pMOS transistor 1 shown in FIG. 1.
Figure 3:
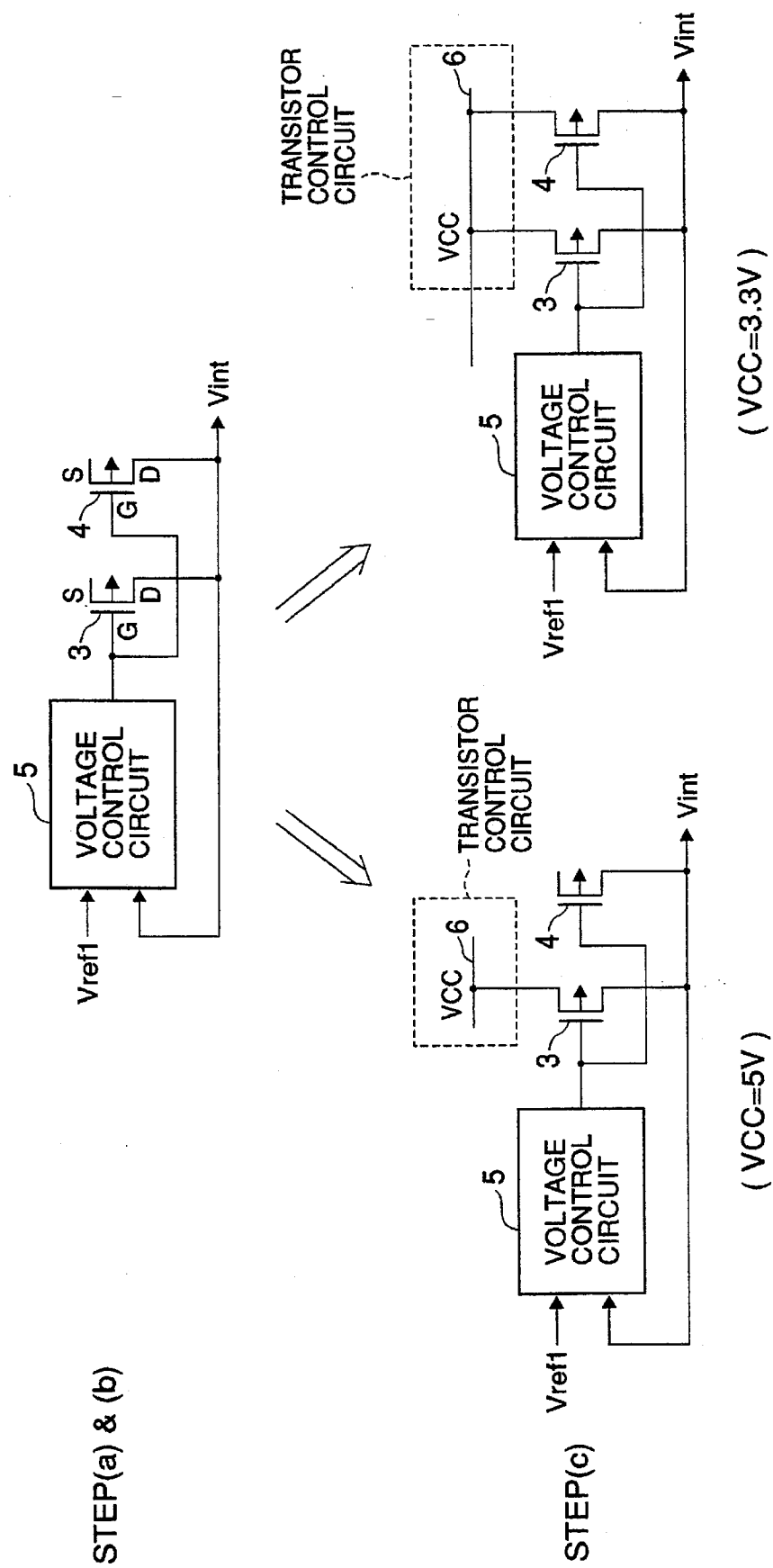
FIG. 3 shows fabricating steps of a selective fabrication method of a first embodiment according to the present invention.

First, a description will be given of a first embodiment of the selective fabrication method of the power-supply-voltage reduction device according to the present invention, by referring to FIGS. 3 to 11. FIG. 3 shows fabricating steps of the selective fabrication method of the first embodiment according to the present invention.

In a step (a), enhancement-type pMOS transistors 3, 4 are formed, of which drains as current electrodes are connected to each other. These transistors 3, 4 are operable as regulator transistors to produce at the drains a reduced power supply voltage Vint to be supplied to internal circuits in the DRAM.

In a step (b), a voltage control circuit 5 is formed, to which a reference voltage Vref1 and the reduced power supply voltage Vint are connected. And an output signal of the voltage control circuit 5 is connected to gates as control electrodes of the transistor 3, 4. When an external power supply voltage VCC is applied to sources as current electrodes of the transistors 3, 4, the voltage control circuit 5 compares the reduced power supply voltage Vint with the reference voltage Vref1. And subsequently, by supplying a control signal to the gates of the transistors 3, 4, the circuit 5 controls the transistors 3, 4 to produce a constant reduced power supply voltage which has the substantially same level as that of the reference voltage Vref1.

Next, in a step (c), when an external power supply voltage VCC of 5 V will be supplied to a power supply line 6, the power supply line 6 as a transistor control circuit is formed by connecting the source of the pMOS transistor 3 to the line 6. In this circuit, the source of the pMOS transistor 4 is not connected to the power supply line 6. On the other hand, when an external power supply voltage VCC of 3.3 V will be supplied to the power supply line 6, the power supply line 6 is formed by connecting both the sources of the transistors 3, 4 to the line 6. In this way, for a low external power supply voltage such as 3.3 V, the two transistors are activated to provide a sufficient current supply to the internal circuits.

In the above fabrication method, by selectively forming the power supply line 6, activation/deactivation of the transistors 3, 4 is easily controlled. When fabricating a semiconductor integrated circuit such as the DRAM, such a selective formation of the power supply line 6 is easily implemented by means of using different mask patterns for routing lines.

Figure 4:
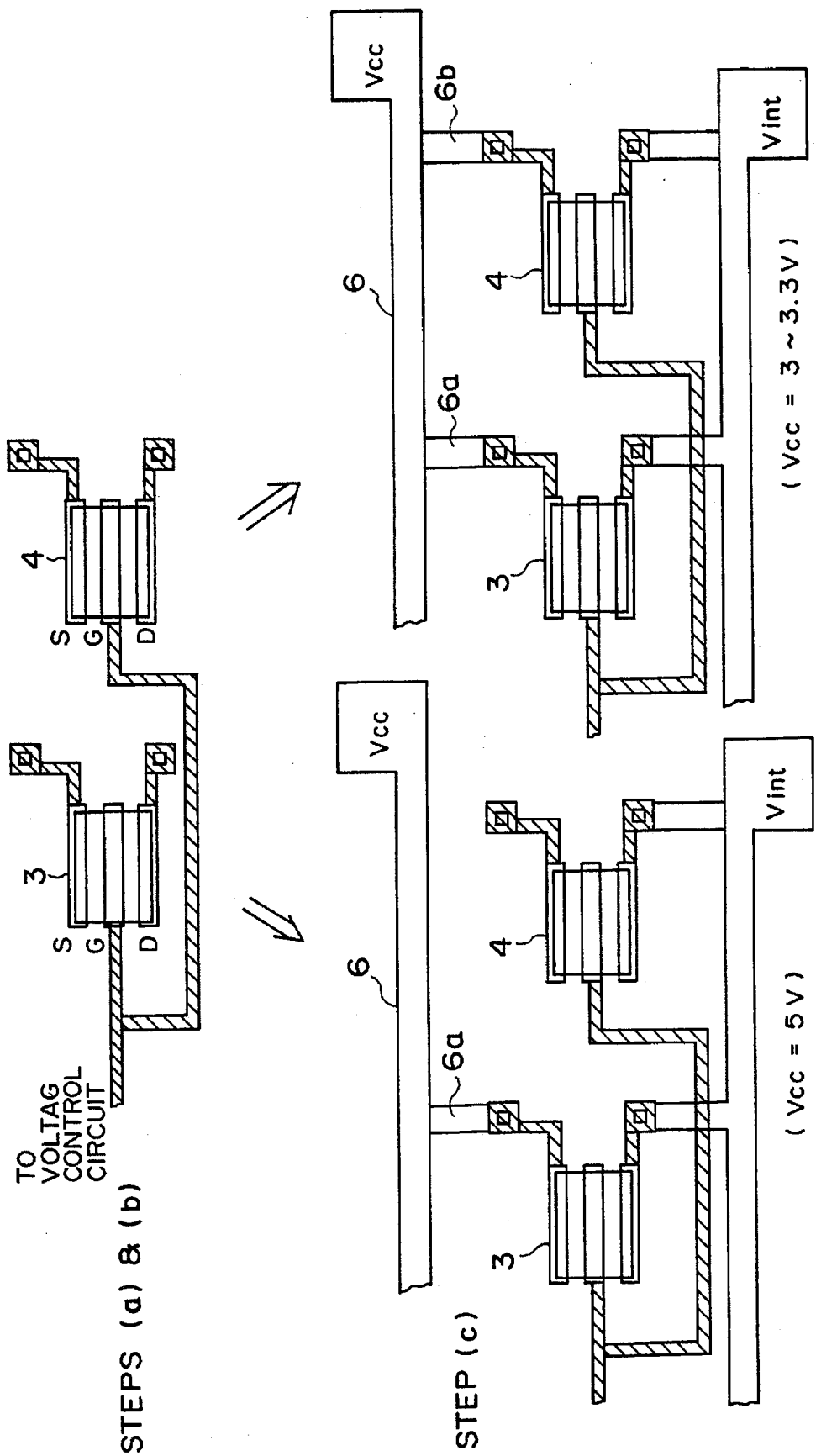
FIG. 4 shows a plan view of one example of a pattern layout of transistors 3, 4 and a power supply line 6 in the selective fabrication method shown in FIG. 3.

FIG. 4 shows a plan view of one example of a pattern layout of the transistors 3, 4 and the power supply line 6 in the selective fabrication method. In this figure, white lines such as the power supply line 6 reveal first layer lines, and hatched lines reveal second layer lines. The first layer line is connected to the second layer line via throughholes which are represented by small squares.

In the steps (a) and (b), patterns of transistors 3, 4 and the second layer lines are formed. Next, in the step (c), the first layer lines including the power supply line 6 are formed. In this example, an output line for the reduced power supply voltage Vint is formed with the power supply line 6. When the external power supply voltage VCC of 5 V will be supplied to the power supply line 6, the mask pattern for forming the first layer lines with a line 6a are used. On the other hand, for the external power supply voltage VCC of 3.3 V, the mask pattern for forming the first layer lines with lines 6a, 6b are used. In this way, by changing the mask pattern, a selective fabrication of the power-supply-voltage reduction device for different power supply voltages is easily implemented.

The voltage control circuit 5 is constructed to control the pMOS transistors 3, 4 with a digital signal or an analog signal, operations of which will be described in the followings.

Figure 5:
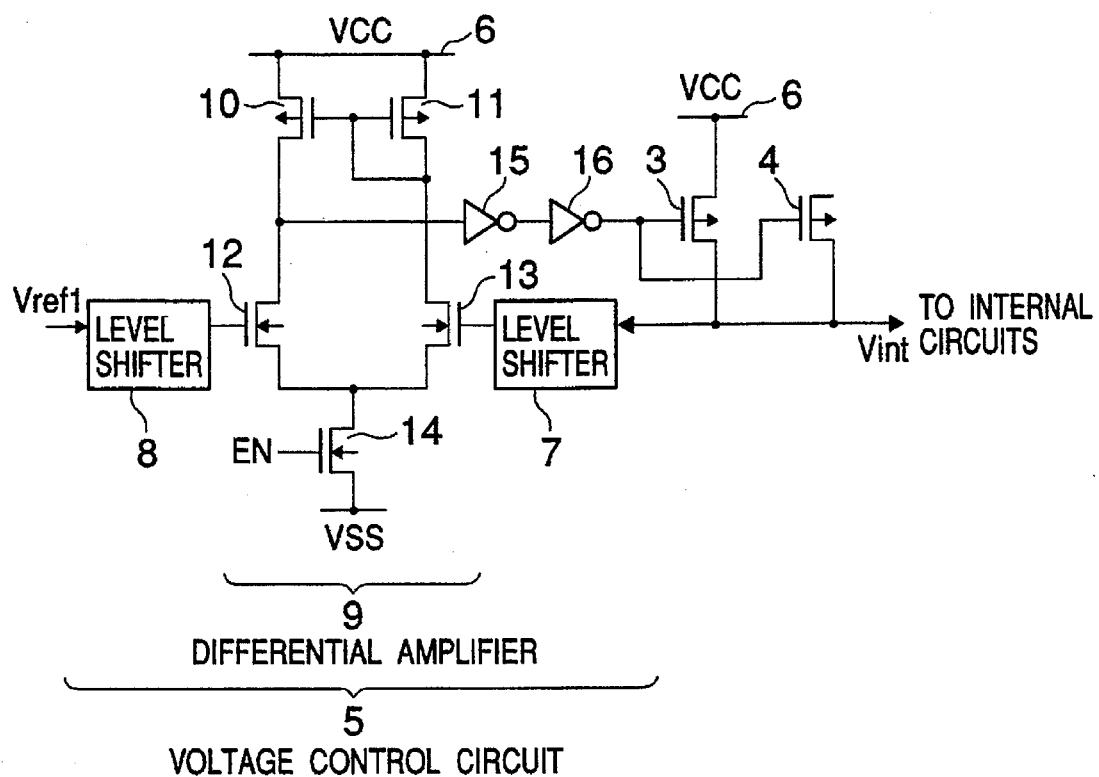
FIG. 5 shows a schematic diagram of the power-supply-voltage reduction circuit for a digital control with a VCC of 5 V shown in FIG. 3.

First, a description will be given of a digital control operation of the pMOS transistors 3, 4 in the power-supply-voltage reduction device. FIG. 5 shows a schematic diagram of the power-supply-voltage reduction circuit for the digital control with the VCC of 5 V shown in FIG. 3, and FIG. 6 shows a schematic diagram of the power-supply-voltage reduction circuit for the digital control operation with the VCC of 3.3 V shown in FIG. 3.

Figure 6:
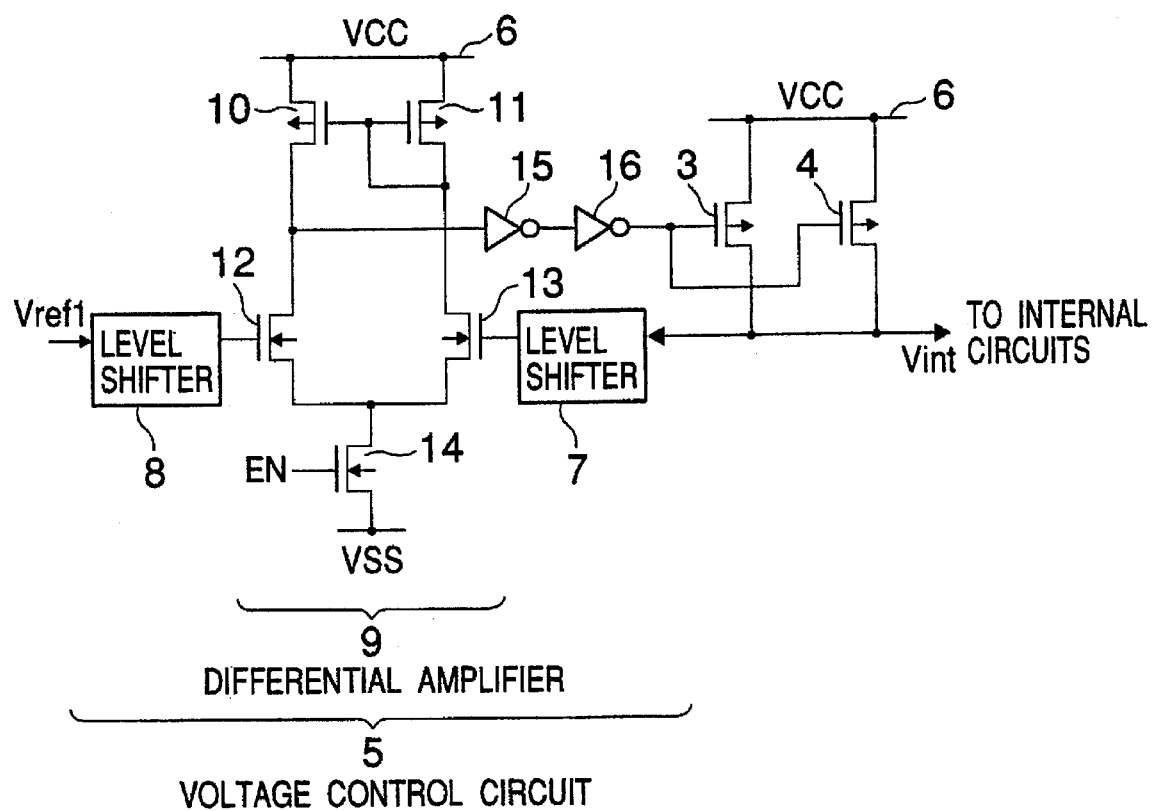
FIG. 6 shows a schematic diagram of the power-supply-voltage reduction circuit for the digital control with a VCC of 3.3 V shown in FIG. 3.

In FIGS. 5, 6, the voltage control circuit 5 comprises a level shifter 7 level shifting the reduced power supply voltage Vint to a lower voltage, a level shifter 8 level shifting the reference voltage Vref1 to the lower voltage, and a differential amplifier 9 differentially amplifying outputs of the level shifters 7, 8.

The differential amplifier 9 includes enhancement-type pMOS transistors 10, 11 constructing a current mirror circuit as a load, enhancement-type nMOS transistors 12, 13 for driving transistors, and an nMOS transistor 14 for a constant current source, which is controlled to be activated (ON) or to be deactivated (OFF) by a differential-amplifier activating signal EN. When the nMOS transistor 14 is activated, the transistor 14 is in a conductive condition, when being deactivated, the transistor 14 draws no current from the transistors 12, 13.

And a drain of the nMOS transistor 12 is connected to the gates of the pMOS transistors 3, 4 via two inverters 15, 16 to supply the output signal of the differential amplifier 9. The inverters 15, 16 are connected to reshape a wave of the output signal. An output of the inverter 16 controls the gate of the pMOS transistor 3 in the device shown in FIG. 5, and controls the gates of the pMOS transistors 3, 4 in the device shown in FIG. 6.

Figure 7:
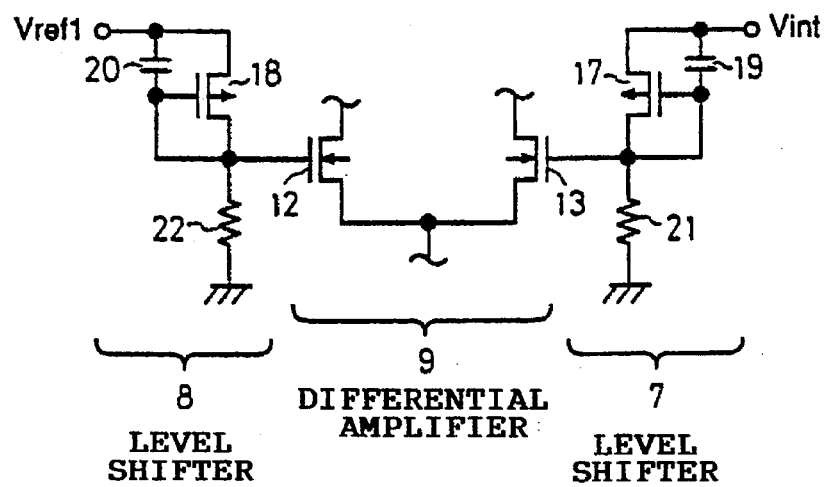
FIGS. 7 to 9 show schematic diagrams of 3 examples of level shifters 7, 8 in a differential amplifier 9 shown in FIGS. 5, 6.
Figure 8:
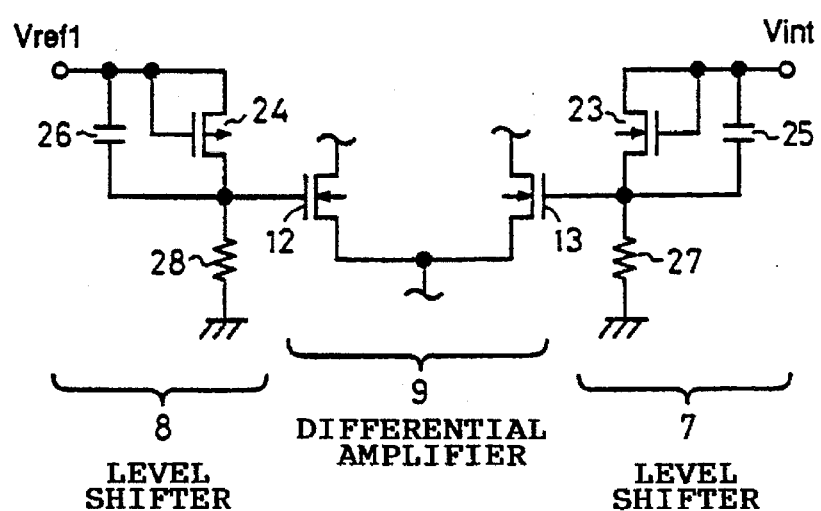
Figure 9:
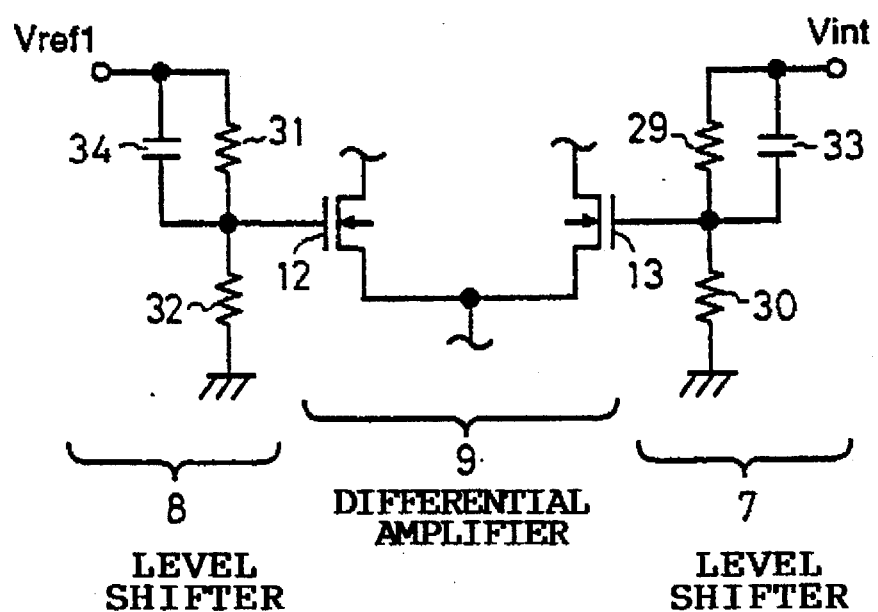

The level shifters 7, 8 are disposed to obtain a sufficient gain of the differential amplifier 9 and ensure a response of the current mirror circuit for the external power supply voltage of 3.3 V, and are constructed in such a manner as shown in FIGS. 7 to 9.

FIGS. 7 to 9 show schematic diagrams of 3 examples of the level shifters 7, 8 in the differential amplifier 9. As shown in FIG. 7, the level shifters 7, 8 include enhancement-type pMOS transistors 17, 18, capacitors 19, 20, and resistances 21, 22. The level shifters 7, 8 shown in FIG. 8 include enhancement-type nMOS transistors 23, 24, capacitors 25, 26, and resistances 27, 28. The level shifters 7, 8 shown in FIG. 9 include resistances 29 to 32, and capacitors 33, 34. The capacitors 19, 20 in FIG. 7, the capacitors 25, 26 in FIG. 8, and the capacitors 33, 34 in FIG. 9 are disposed for phase compensation. For example, in the level shifter 7, a fluctuation part of the reduced power supply voltage Vint which has a high frequency part is directly passed to the nMOS transistor 13 of the differential amplifier 9 via capacitors 19, 25, 33 without level shifting, whereas a direct current part of the reduced power supply voltage is passed with level shifting by the transistors 17, 23 and the resistance 29.

Now, a description will be given of a voltage reduction operation of the power-supply-voltage reduction device shown in FIG. 5. In the device shown in FIG. 5, when the reduced power supply voltage Vint is higher than the reference voltage Vref1, a drain voltage of the nMOS transistor 12 is increased, so that an output of the inverter 15 becomes a low level and the output of the inverter 16 becomes a high level. Therefore, the pMOS transistor 3 is deactivated to reduce the reduced power supply voltage Vint.

On the other hand, when the reduced power supply voltage Vint is less that the reference voltage Vref1, the drain voltage of the nMOS transistor 12 is decreased, so that the output of the inverter 15 becomes the high level and the output of the inverter 6 becomes the low level. Therefore, the pMOS transistor 3 is activated to increase the reduced power supply voltage Vint.

And sequentially, the reduced power supply voltage Vint generated in the drain of the pMOS transistor 3 is fed back to the voltage control circuit 5. The voltage control circuit 5 compares the reduced power supply voltage Vint with the reference voltage Vref1 and produces the control signal to switch the activation/deactivation of the pMOS transistor 3 as described above. This switching control of the voltage control circuit 5 enables the pMOS transistor 3 to produce a constant reduced power supply voltage Vint.

In the device shown in FIG. 6, when the reduced power supply voltage Vint is higher than the reference voltage Vref1, the drain voltage of the nMOS transistor 12 is increased, so that the output of the inverter 15 becomes the low level and the output of the inverter 16 becomes the high level. Therefore, the pMOS transistors 3, 4 are deactivated to reduce the reduced power supply voltage Vint.

On the other hand, when the reduced power supply voltage Vint is less than the reference voltage Vref1, the drain voltage of the nMOS transistor 12 is decreased, so that the output of the inverter 15 becomes the high level and the output of the inverter 16 becomes the low level. Therefore, the pMOS transistors 3, 4 are activated to increase the reduced power supply voltage Vint.

And sequentially, the reduced power supply voltage Vint generated in the drains of the pMOS transistors 3, 4 are fed back to the voltage control circuit 5. The voltage control circuit 5 compares the reduced power supply voltage Vint with the reference voltage Vref1 and produces the control signal to switch the activation/deactivation of the pMOS transistors 3, 4 as described above. This switching control of the voltage control circuit 5 enables the pMOS transistors 3, 4 to produce the constant reduced power supply voltage Vint.

Figure 10:
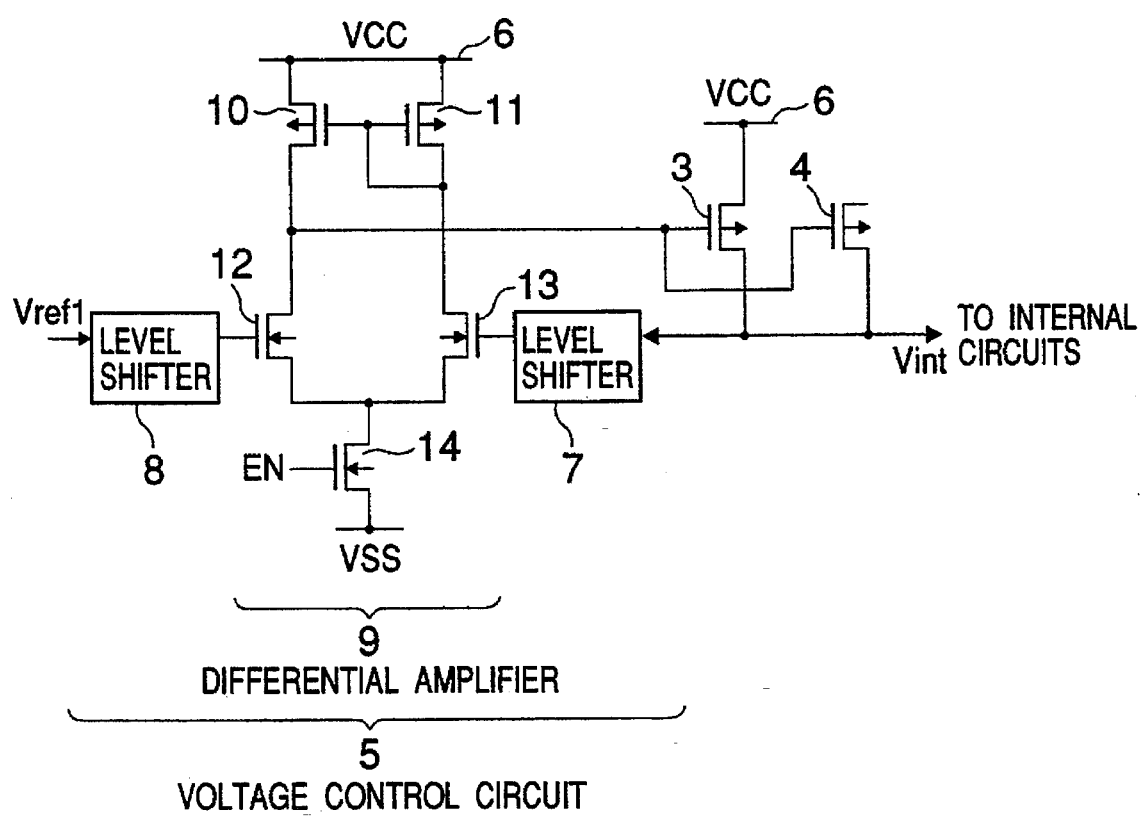
FIG. 10 shows a schematic diagram of the power-supply-voltage reduction circuit for an analog control with the VCC of 5 V shown in FIG. 3.

Next, a description will be given of an analog control operation of the pMOS transistors 3, 4 by the voltage control circuit 5 in the power-supply-voltage reduction device. FIG. 10 shows a schematic diagram of the power-supply-voltage reduction circuit for the analog control with the VCC of 5 V shown in FIG. 3, and FIG. 11 shows a schematic diagram of the power-supply-voltage reduction circuit for the analog control with the VCC of 3.3 V shown in FIG. 3.

Figure 11:
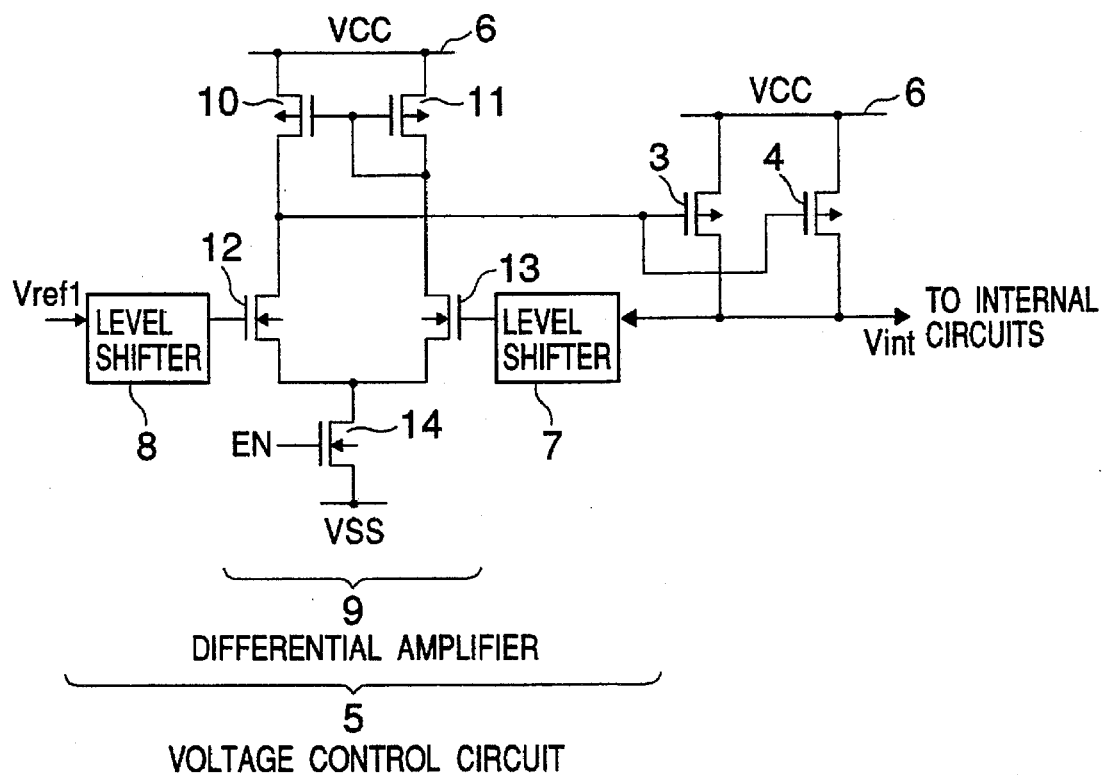
FIG. 11 shows a schematic diagram of the power-supply-voltage reduction circuit for the analog control with the VCC of 3.3 V shown in FIG. 3.

In the power-supply-voltage reduction devices shown in FIGS. 10, 11, the inverters 15, 16 of the voltage control circuits 5 are eliminated from the devices shown in FIGS. 5, 6. Therefore, in the device shown in FIG. 10, the drain of the nMOS transistor 12 is connected to the gate of the pMOS transistor 3, and in the device shown in FIG. 11, the drain of the nMOS transistor 12 is connected to the gates of the pMOS transistors 3, 4.

In the device shown in FIG. 10, when the reduced power supply voltage Vint is higher than the reference voltage Vref1, the drain voltage of the nMOS transistor 12 is increased, so that a value of a resistance for activation in the pMOS transistor 3 is increased to reduce the reduced power supply voltage Vint.

On the other hand, when the reduced power supply voltage Vint is less that the reference voltage Vref1, the drain voltage of the nMOS transistor 12 is decreased, so that the value of the resistance for activation in the pMOS transistor 3 is decreased to increase the reduced power supply voltage Vint.

And sequentially, the reduced power supply voltage Vint generated in the drain of the pMOS transistor 3 is fed back to the voltage control circuit 5. The voltage control circuit 5 compares the reduced power supply voltage Vint with the reference voltage Vref1 and produces the control signal to change the value of the resistance for activation in the pMOS transistor 3 as described above. By the voltage control circuit 5 changing the value of the resistance in the pMOS transistor 3 according to a difference between the reduced power supply voltage Vint and the reference voltage Vref1, the pMOS transistor 3 is controlled to produce the constant reduced power supply voltage Vint.

And in the device shown in FIG. 11, when the reduced power supply voltage Vint is higher than the reference voltage Vref1, the drain voltage of the nMOS transistor 12 is increased, so that the values of the resistances for activation in the pMOS transistors 3, 4 are increased to reduce the reduced power supply voltage Vint.

On the other hand, when the reduced power supply voltage Vint is less that the reference voltage Vref1, the drain voltage of the nMOS transistor 12 is decreased, so that the values of the resistances for activation in the pMOS transistors 3, 4 are decreased to increase the reduced power supply voltage Vint.

And sequentially, the reduced power supply voltage Vint generated in the drains of the pMOS transistor 3, 4 is fed back to the voltage control circuit 5. The voltage control circuit 5 compares the reduced power supply voltage Vint with the reference voltage Vref1 and produces the control signal to change the values of the resistances for activation in the pMOS transistors 3, 4 as described above. By the voltage control circuit 5 changing the value of the resistances in the pMOS transistors 3, 4 according to the difference between the reduced power supply voltage Vint and the reference voltage Vref1, the pMOS transistors 3, 4 are controlled to produce the constant reduced power supply voltage Vint.

Here, a calculation will be given of the current supply abilities in the devices shown in FIGS. 5, 6. In this calculation, a desired reduced power supply voltage Vint is set to 3 V. And the current supply ability can be calculated on the assumption that the output of the inverter 16 is the low level to set the gate voltage of the pMOS transistor 3 to 0 V.

When the external power supply voltage of 5 V is supplied to the power supply line 6 as shown in FIG. 5, a source-drain voltage VSD of the pMOS transistor 3 is 2 V (=5 V−3 V), and a source-gate voltage VSG thereof is 5 V (=5 V−0 V).

On the other hand, when the power supply voltage of 3.3 V is supplied to the power supply line 6 shown in FIG. 6, each source-drain voltage VSD of the pMOS transistors 3, 4 is 0.3 V (=3.3 V−3 V), and each source-gate voltage VSG thereof is 3.3 V (=3.3 V−0 V).

In general, a source-drain current ISD of the pMOS transistor is calculated as follows:

$$ISD = K(W/L)(2 \times (VSG-VTHP)VSD-VSD^2),$$

where W is a channel width, L is a channel length, K is a specific value which is determined by a mobility and a capacitance of an insulated film, and VTPH is a threshold voltage of the pMOS transistor.

Here, it is assumed that the channel width and the channel length of the pMOS transistor 3 are $W_3$, and $L_A$, respectively, and the channel width and the channel length of the pMOS transistor 4 are $W_4$, and $L_A$, and the VTHP is 0.5 V. For the external power supply voltage of 5 V, the source-drain current $ISD_{5\,V}$ of the pMOS transistor 3 is calculated as follows:

$$\begin{aligned} ISD_{5V} &= K(W_3/L_A)(2(5-0.5) \times 2 - 2^2) \\ &= 14KW_3/L_A. \end{aligned}$$

For the external power supply voltage of 3.3 V, a total of the source-drain current ISD3.3 V of the pMOS transistors 3, 4 is calculated as follows:

$$\begin{aligned} ISD_{3.3V} &= K((W_3+W_4)/L_A) \times (2(3.3-0.5) \times 0.3 - 0.3^2) \\ &= 1.59K(W_3+W_4)/L_A. \end{aligned}$$

In the case that $ISD_{5\,V} = ISD_{3.3\,V}$, $W_3/W_4$ is 1/7.8. Therefore, if the channel width $W_4$ of the pMOS transistor 4 is formed to be 7.8 times the channel width $W_3$ of the pMOS transistor 3, the current supply ability of the device for the VCC of 3.3 V shown in FIG. 6 may be substantially equal to that of the device for the VCC of 5 V shown in FIG. 5.

In this selective fabrication method, first, the pMOS transistors 3, 4 necessary for a 3.3 V device are preformed, and next, either the 3.3 V device or a 5 V device is selectively fabricated by a metal option such as forming of the power supply line 6.

Therefore, such a selective fabrication method makes it possible to selectively fabricate the power-supply-voltage reduction device for the different external power supply voltage in one fabrication process. Since the power-supply-voltage reduction device for the low external power supply voltage is constructed with a plurality of transistors, this voltage reduction device may have the sufficient current supply ability to achieve the stable operating speed and the stable reduced supply voltage.

Further, if the channel construction of the pMOS transistor 3 is associated with that of the pMOS transistor 4 by the given relationship, the 3.3-V device may have the substantially same current supply ability as the 5.5 V-device.

On a consideration of this selective fabrication method, another method such as selecting either one transistor for VCC of 3.3 V or another transistor for VCC of 5 V has also been taken into account. However, since the transistor for VCC of 3.3 V must have the sufficient current supply ability by itself, an extremely large size is required for this transistor, so that this size requirement makes the power-supply-voltage reduction device larger than the device according to the present invention.

In the fabrication method according to the present invention, a large capacitance such as 100 to 1000 pF may be connected to an output side of the reduced power supply voltage. The large capacitance is operative for suppressing a peak current occurring during operation of a sense amplifier or a decoder. Especially, for the digital control of the transistors 3, 4 in the device shown in FIGS. 5, 6, the capacitance is operative for suppressing a bump of the reduced power supply voltage Vint and obtaining a stable voltage level, and for the analog control of the transistors 3, 4 in the device shown in FIGS. 10, 11, the capacitance is operative for a phase compensation.

Figure 12:
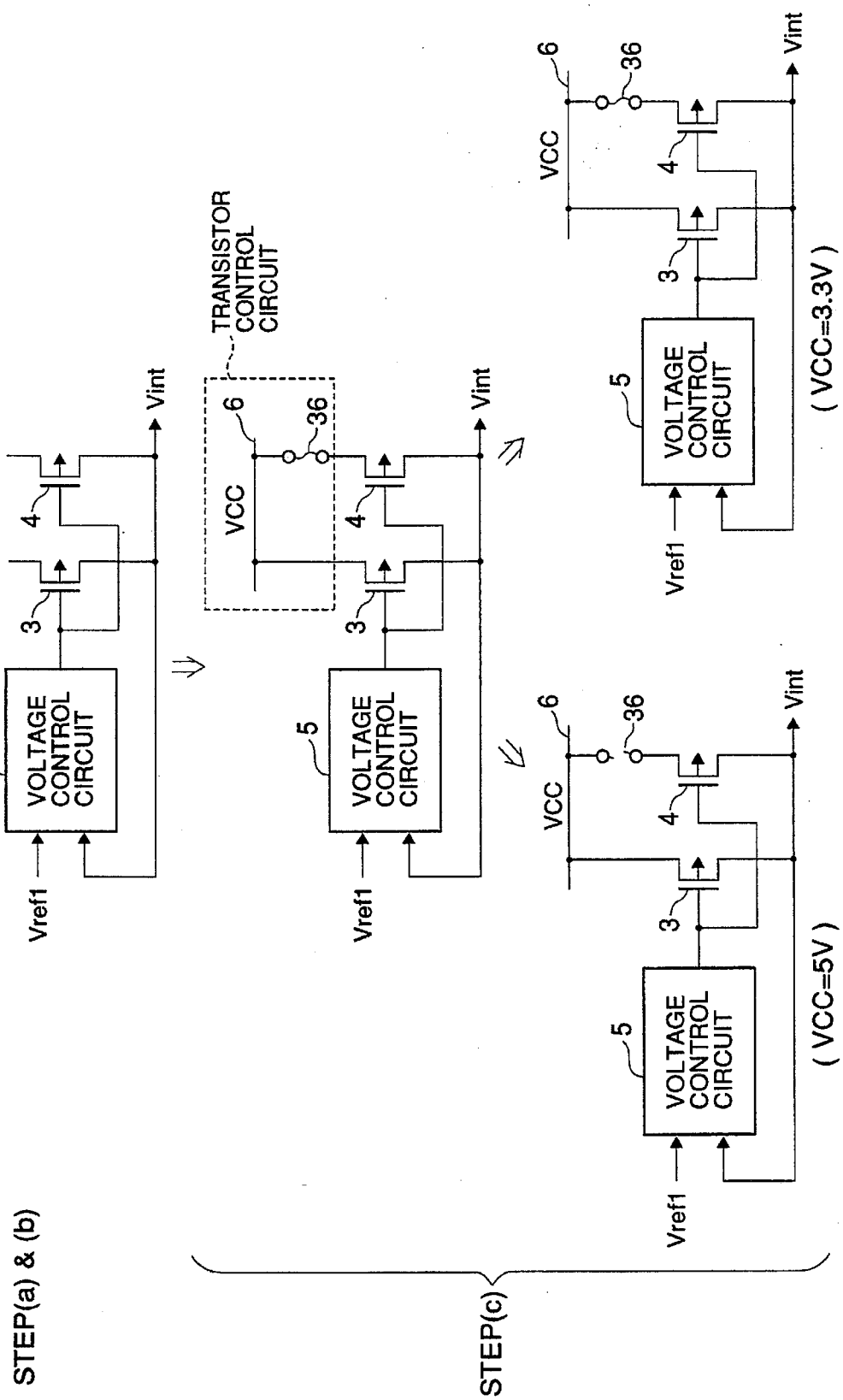
FIG. 12 shows fabricating steps of the selective fabrication method of a second embodiment according to the present invention.

Next, a description will be given of a second embodiment of the selective fabrication method of the power-supply-voltage reduction device according to the present invention, by referring to FIG. 12. FIG. 12 shows fabricating steps of the selective fabrication method of the second embodiment according to the present invention.

In a step (a), the enhancement-type pMOS transistors 3, 4 are formed in the same manner as the step (a) of the first embodiment of the selective fabrication method. Therefore, these transistors 3, 4 are also operable as regulator transistors to produce at the drains the reduced power supply voltage Vint to be supplied to internal circuits in the DRAM.

In a step (b), the voltage control circuit 5 is also formed in the same manner as the step (b) of the first embodiment of the selective fabrication method. Therefore, when the external power supply voltage VCC is applied to sources as current electrodes of the transistors 3, 4, the voltage control circuit 5 compares the reduced power supply voltage Vint with the reference voltage Vref1. And subsequently, by supplying the control signal to the gates of the transistors 3, 4, the circuit 5 controls the transistors 3, 4 to produce the constant reduced power supply voltage which has the substantially same level as that of the reference voltage Vref1.

This voltage control circuit 5 may be constructed as has been shown in FIGS. 5 to 11.

Next, in a step (c), first, a transistor control circuit is constructed such that, the source of the pMOS transistor 3 is connected to the power supply line 6 to be supplied with the external power supply voltage, and the source of the pMOS transistor 4 is connected to the power supply line 6 via a fuse 36. The above steps are carried out by a process for forming routing lines.

After forming the routing line with the power supply line and the fuse, when the external power supply voltage VCC of 5 V will be supplied to the power supply line 6, the fuse is disconnected, so that only pMOS transistor 3 is activated as the regulator transistor. The fuse may be cut by an electrical operation, and also by a cutter or a laser beam. On the other hand, when the external power supply voltage VCC of 3.3 V will be supplied to the power supply line 6, the fuse is not disconnected, so that the pMOS transistors 3, 4 are activated as the regulator transistors.

Figure 13:
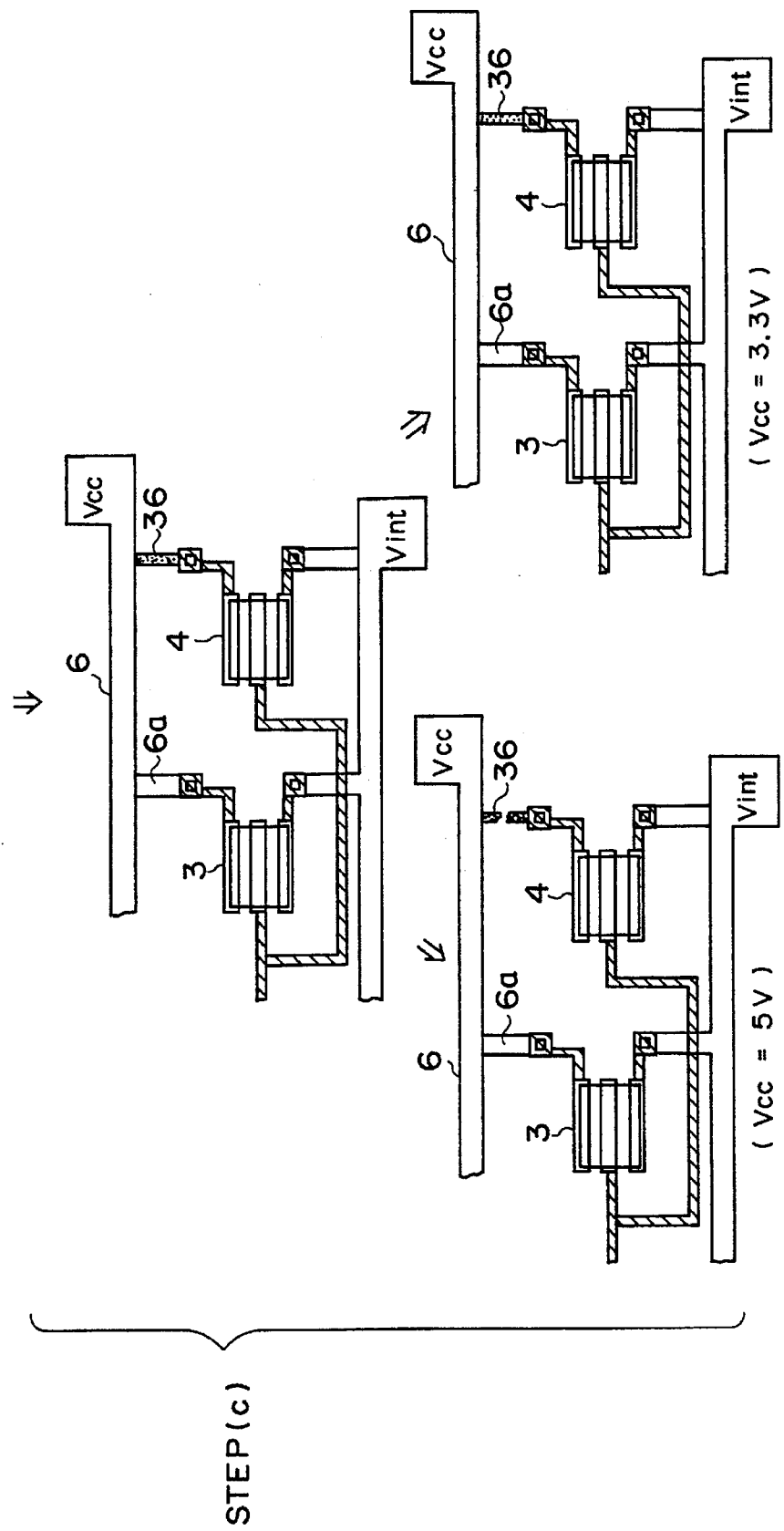
FIG. 13 shows a plan view of one example of a pattern layout of the transistors 3, 4 and a transistor control circuit in the selective fabrication method.

FIG. 13 shows a plan view of one example of a pattern layout of the transistors 3, 4 and the transistor control circuit in the selective fabrication method. In the steps (a) and (b), patterns of transistors 3, 4 and the second layer lines are formed as described in FIG. 4. Next, in the step (c), the first layer lines including the power supply line 6 and the fuse 36 are formed, where the source of the pMOS transistor 3 is connected to the power supply line 6 via the line 6a, and the source of the pMOS transistor 4 is connected to the power supply line 6 via the fuse 36.

After routing the second and the first layer lines, when the external power supply voltage VCC of 5 V will be supplied to the power supply line 6, the fuse 36 is disconnected. In this way, by cutting the fuse 36 with such the electrical method, the selective fabrication of the power-supply-voltage reduction device for different power supply voltages is easily implemented. In other words, in this selective fabrication method, either the 3.3 V device or a 5 V device is easily fabricated by a fuse option.

Therefore, such a selective fabrication method makes it possible to selectively fabricate the power-supply-voltage reduction device for the different external power supply voltage in one fabrication process. Since the power-supply-voltage reduction device for the low external power supply voltage is constructed with a plurality of transistors, this voltage reduction device may have the sufficient current supply ability to achieve the stable operating speed and the stable reduced supply voltage.

Further, if the channel construction of the pMOS transistor 3 is associated with that of the pMOS transistor 4 by the given relationship (for example, the channel width $W_4$ of the pMOS transistor 4 is 7.8 times the channel width $W_3$ of the pMOS transistor 3), the 3.3-V device may have the substantially same current supply ability as the 5-V device.

Next, a description will be given of a third embodiment of the selective fabrication method of the power-supply-voltage reduction device according to the present invention, by referring to FIG. 14. FIG. 14 shows fabricating steps of the selective fabrication method of the third embodiment according to the present invention.

In a step (a), the enhancement-type pMOS transistors 3, 4 are formed in the same manner as the step (a) of the first embodiment of the selective fabrication method. Therefore, these transistors 3, 4 are also operable as regulator transistors to produce at the drains the reduced power supply voltage Vint to be supplied to internal circuits in the DRAM.

In a step (b), the voltage control circuit 5 is also formed in the same manner as the step (b) of the first embodiment of the selective fabrication method. This voltage control circuit 5 may be constructed as has been shown in FIGS. 5 to 11.

Next, in a step (c), first, a transistor control circuit is constructed such that, the source of the pMOS transistor 3 is connected to the power supply line 6, and a pMOS transistor 37 is formed in which a drain of the pMOS transistor 37 is connected to the source of the pMOS transistor 4, and a source of the pMOS transistor 37 is connected to the power supply line 6. Further, a fuse 38 is formed to connect a gate of the pMOS transistor 37 to the power supply line 6, and a fuse 39 is formed to connect the gate of the pMOS transistor 37 to the ground. The above steps are carried out during the process for forming the routing lines.

After forming the routing line with the power supply line and the fuses, when the external power supply voltage VCC of 5 V will be supplied to the power supply line 6, the fuse 39 is disconnected by such as the electrical operation, the cutter or the laser beam to deactivate the pMOS transistor 37, so that only pMOS transistor 3 is activated as the regulator transistor.

On the other hand, when the external power supply voltage VCC of 3.3 V will be supplied to the power supply line 6, the fuse 38 is disconnected to activate the pMOS transistor 37, so that the pMOS transistors 3, 4 are activated as the regulator transistors.

Also, this fabrication method may be constructed in a similar manner to the pattern construction shown in FIG. 13. However, in this fabrication method, the pMOS transistor 37 is formed with the pMOS transistors 3, 4, and the fuses 38, 39 are formed with the power supply line 6. In this way, in this selective fabrication method, either the 3.3 V device or a 5 V device is easily fabricated with a fuse option.

Therefore, such a selective fabrication method makes it possible to selectively fabricate the power-supply-voltage reduction device for the different external power supply voltage in one fabrication process. Since the power-supply-voltage reduction device for the low external power supply voltage is constructed with a plurality of transistors, this voltage reduction device may have the sufficient current supply ability to achieve the stable operating speed and the stable reduced supply voltage.

Further, if the channel construction of the pMOS transistor 3 is associated with that of the pMOS transistor 4 by the given relationship (for example, the channel width $W_4$ of the pMOS transistor 4 is 7.8 times the channel width $W_3$ of the pMOS transistor 3), the 3.3-V device may have the substantially same current supply ability as the 5-V device.

Figure 15A:
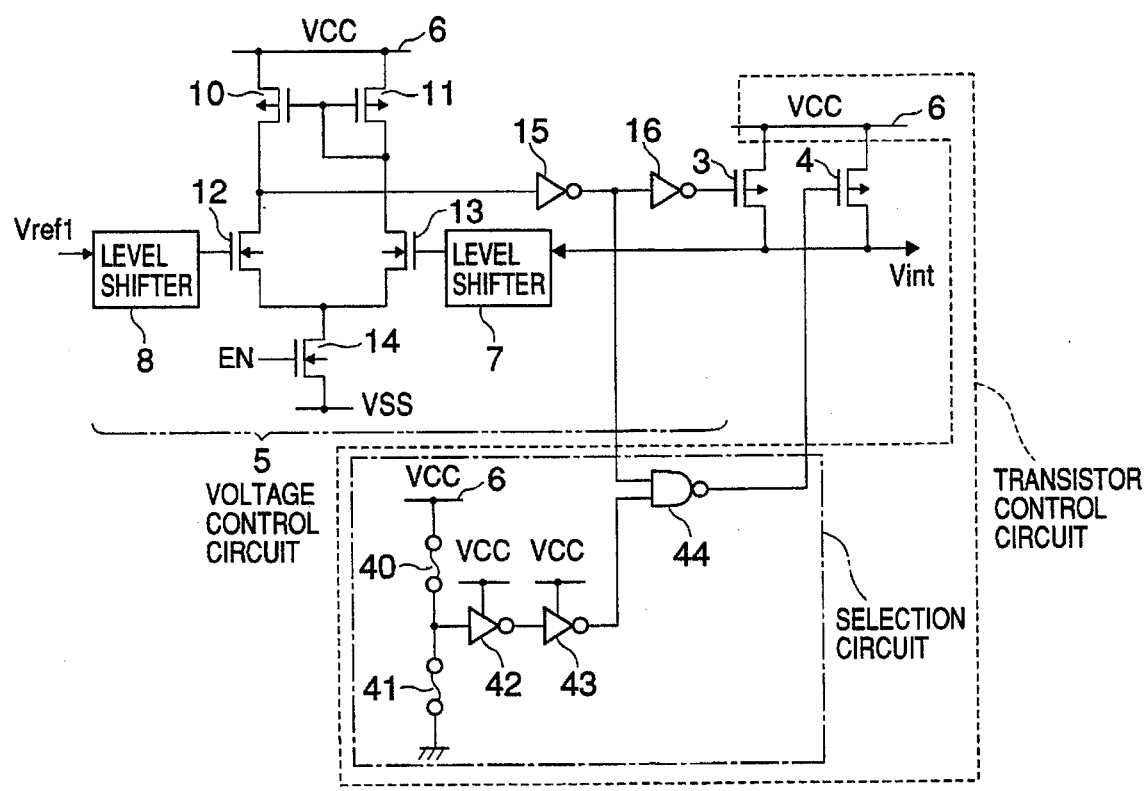
FIG. 15A shows a fabricating step of a transistor control circuit in the selective fabrication method of a fourth embodiment according to the present invention.
Figure 15B:
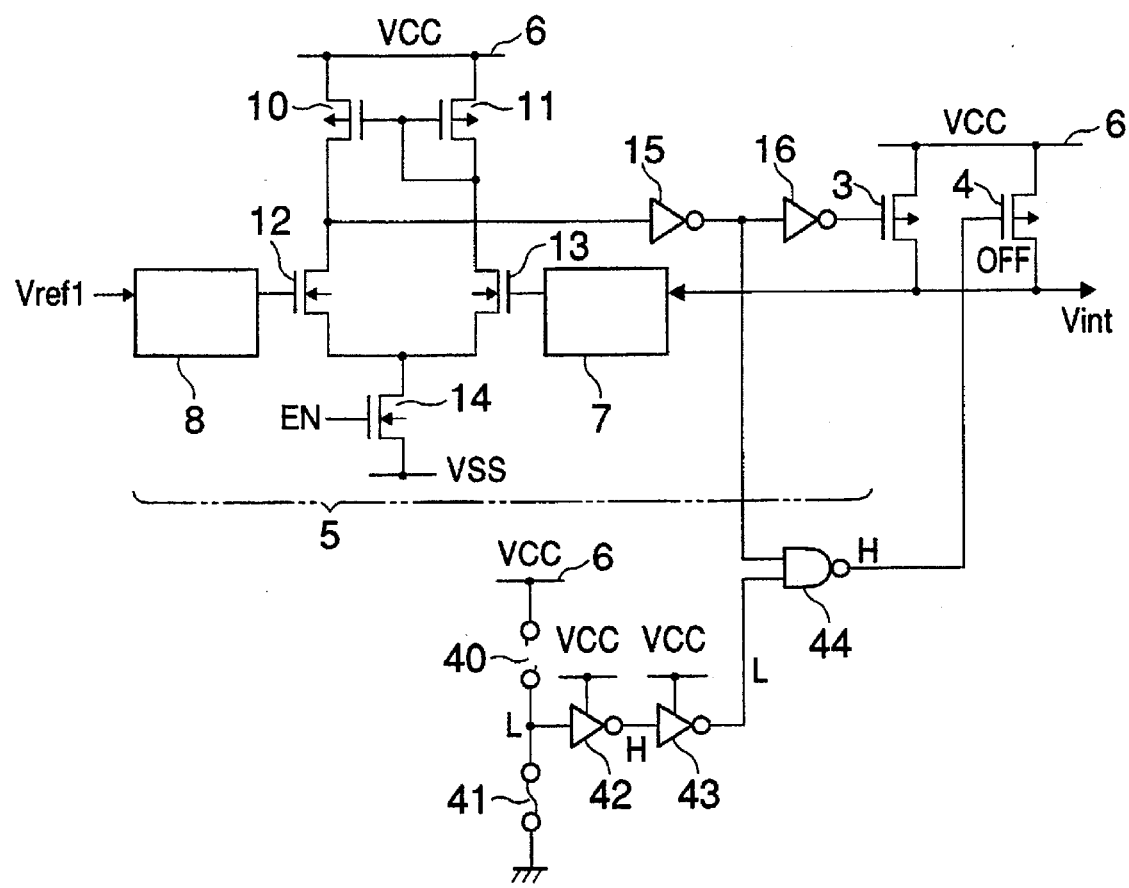
FIG. 15B and FIG. 15C show selection steps for VCCs of 5 V and 3.3 V, respectively, in the selective fabrication method of the fourth embodiment.
Figure 15C:
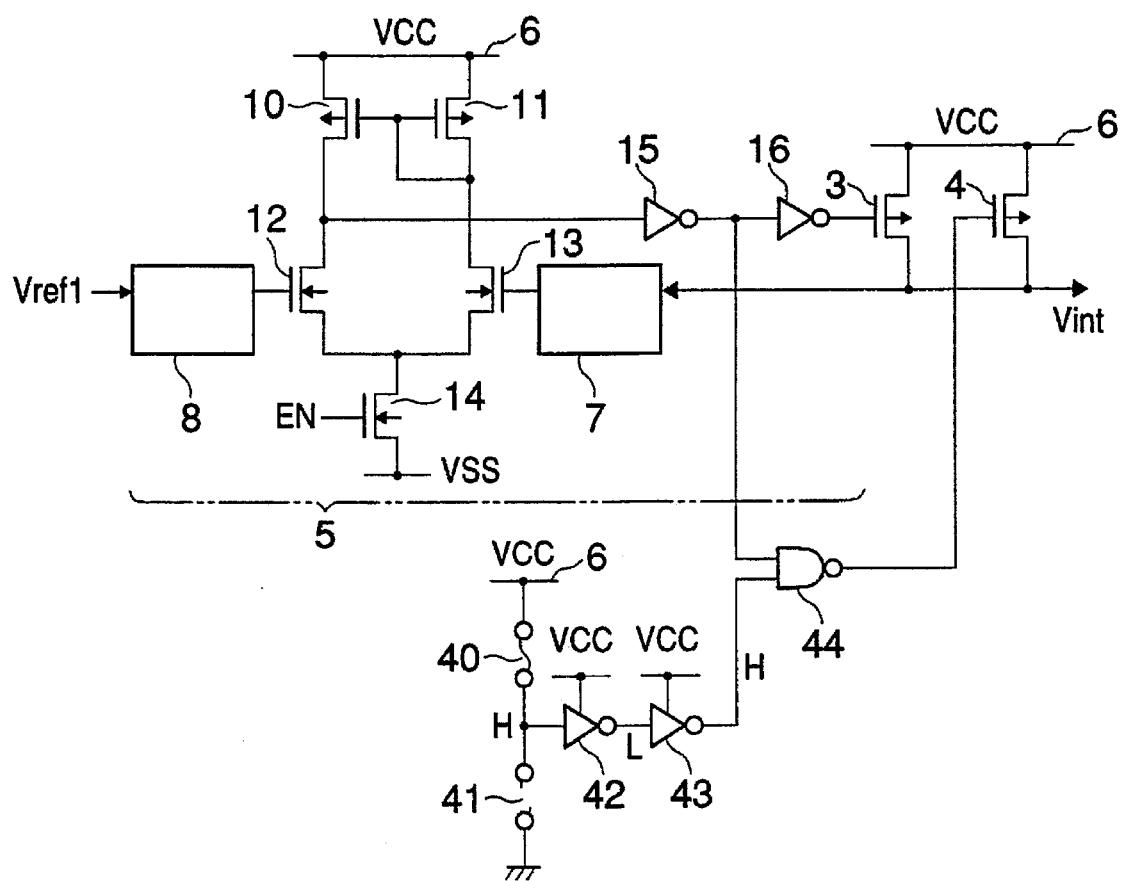

Next, a description will be given of a forth embodiment of the selective fabrication method of the power-supply-voltage reduction device according to the present invention, by referring to FIGS. 15A to 15C. FIG. 15A shows a fabrication step of a transistor control circuit in the selective fabrication method of the forth embodiment according to the present invention. A power-supply-voltage reduction device shown in FIG. 15A is formed through the steps (a), (b), and a portion of (c). FIG. 15B and FIG. 15C show selection steps for VCC of 5 V and 3.3 V, respectively, in the selective fabrication method.

In a step (a), enhancement-type pMOS transistors 3, 4 are formed in the same manner as the step (a) of the first embodiment of the selective fabrication method. In a step (b), a voltage control circuit 5 is also formed in the same manner as the step (b) of the first embodiment of the selective fabrication method. This voltage control circuit 5 may be constructed as has been shown in FIGS. 5 to 11.

Next, in a step (c), first, the transistor control circuit is constructed such that, the sources of the pMOS transistors 3, 4 are connected to the power supply line 6, and a selection circuit is formed between the output of the inverter 15 and the gate of the pMOS transistor 4. The selection circuit comprises fuses 40, 41, inverters 42, 43, and a NAND circuit 44. The fuse 40 connects an input of the inverter 42 to the VCC power supply line 6, and the fuse 41 connects the input of the inverter 42 to the ground. An output of the inverter 42 is supplied to one input of the NAND circuit 44 through the inverter 43. And, the output of the inverter 15 is supplied to the other input of the NAND circuit 44, and an output of the NAND circuit 44 is supplied to the gate of the pMOS transistor 4.

In this configuration, the pMOS transistor 3 is controlled by the output of the inverter 16, and the pMOS transistor 4 is controlled by the output of the NAND circuit 44. The NAND circuit 44 is operative as an inverter or is operative to produce a constant voltage for deactivating the pMOS transistor 4. A detailed description will be given in the following.

As shown in FIG. 15B, when the external power supply voltage VCC of 5 V will be supplied to the power supply line 6, the fuse 40 is disconnected by such as the electrical operation, the cutter, or the laser beam. During an operation of the device, the input of the inverter 42 is the low level, the output thereof is the high level, the output of the inverter 43 is the low level, and the output of the NAND circuit 44 is the high level. Therefore, the pMOS transistor 4 is deactivated, so that only the pMOS transistor 3 is operative as the regulator transistor.

On the other hand, as shown in FIG. 15C, when the external power supply voltage VCC of 3.3 V will be supplied to the power supply line 6, the fuse 41 is disconnected. During the operation of the device, the input of the inverter 42 is the high level, the output thereof is the low level, the output of the inverter 43 is the high level. Therefore, the NAND circuit 44 is operative as the inverter against the output of the inverter 15, so that the pMOS transistors 3, 4 are operative as the regulator transistor.

Also, this fabrication method may be constructed in the similar manner to the pattern construction shown in FIG. 13. However, in this fabrication method, the inverters 42, 43, and the NAND circuit 44 are formed with the pMOS transistors 3, 4, and the fuses 40, 41 are formed with the power supply line 6. In this way, in this selective fabrication method, either the 3.3-V device or the 5-V device is easily fabricated by the fuse option.

Therefore, such a selective fabrication method makes it possible to selectively fabricate the power-supply-voltage reduction device for the different external power supply voltage in one fabrication process. Since the power-supply-voltage reduction device for the low external power supply voltage is constructed with a plurality of transistors, this voltage reduction device may have the sufficient current supply ability to achieve the stable operating speed and the stable reduced supply voltage.

Further, if the channel construction of the pMOS transistor 3 is associated with that of the pMOS transistor 4 by the given relationship (for example, the channel width $W_4$ of the pMOS transistor 4 is 7.8 times of the channel width $W_3$ of the pMOS transistor 3), the 3.3-V device may have the substantially same current supply ability as the 5-V device.

In the above, the selective fabrication methods of the power-supply-voltage reduction device have been described. A selection of the device for VCC of 5 V or 3.3 V is carried out during a fabrication process of the device. However, this selection can be carried out by a user after fabricating the device.

FIG. 16 shows a schematic diagram of a first embodiment of the power-supply-voltage reduction device for user selection according to the present invention and its examples for use. This power-supply-voltage reduction device is the same device as the upper schematic diagram shown in FIG. 3. In this device, the power supply line 6 is not connected to the pMOS transistors 3, 4 inside the device, but ports for the sources of the pMOS transistors 3, 4 are formed outside to be supplied with the external power supply voltage.

Then, when the external power supply voltage VCC of 5 V is used, this voltage VCC is connected to only the port for the source of the pMOS transistor 3 outside the device by the user. And when the external power supply voltage VCC of 3.3 V is used, this voltage is connected to both the ports for the sources of the pMOS transistors 3, 4 outside the device by the user. In this way, the user can select the device for VCC of 5 V or 3.3 V by a different connection method of the external power supply voltage VCC. It is noted that an electrical performance of this device during voltage reduction is identical to that of the device fabricated by the selective fabrication method shown in FIG. 3.

In the similar way mentioned above by referring to FIG. 16, the devices shown in the middle tier of FIGS. 12, 14, and the device shown in FIG. 15A are operable as the power-supply-voltage reduction device for user selection, in which the user can select the device for VCC of 5 V or 3.3 V. In these devices, the fuses for selection are formed such that the user can selectively cut the fuse such as by the electrical operation, the cutter, or the laser beam.

Figure 17:
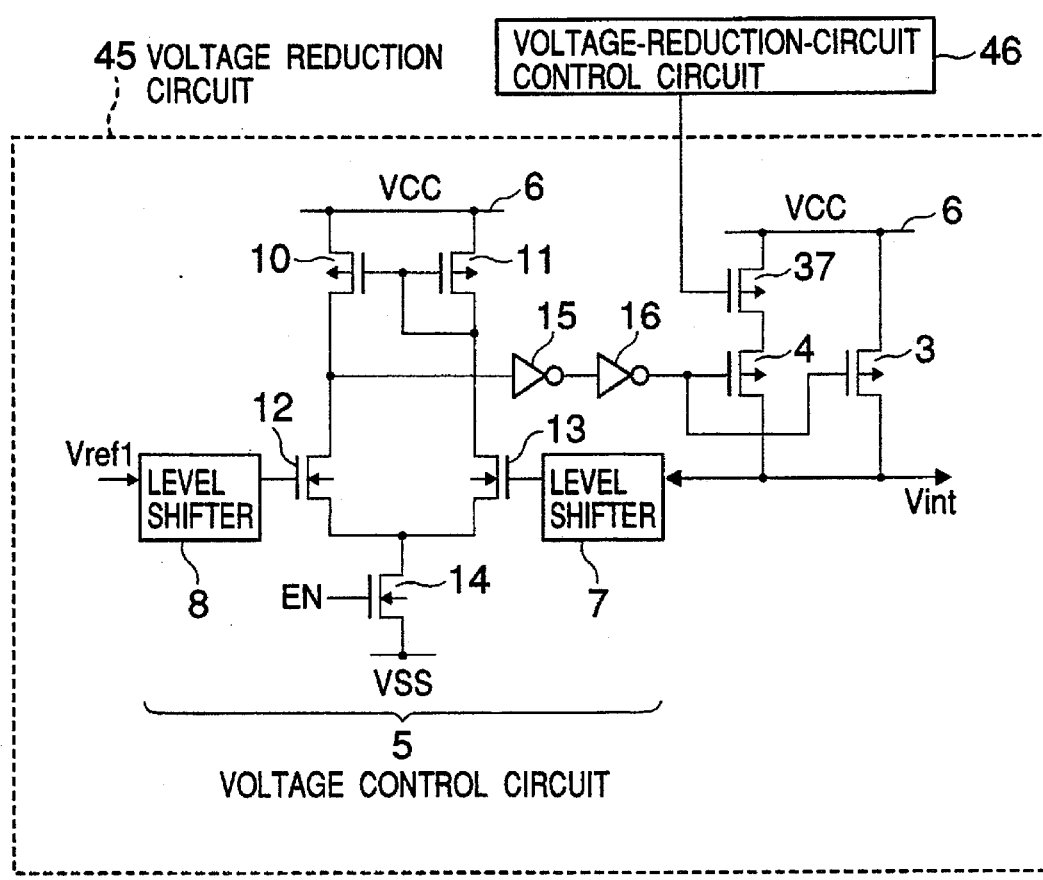
FIG. 17 shows a schematic diagram of a first embodiment of the power-supply-voltage reduction device for an automatic selection according to the present invention.

Next, a description will be given of a first embodiment of the power-supply-voltage reduction device for automatic selection according to the present invention, by referring to FIGS. 17 to 18. FIG. 17 shows a schematic diagram of the first embodiment of the power-supply-voltage reduction device for the automatic selection according to the present invention. And FIG. 18 shows a schematic diagram of a voltage-reduction-circuit control circuit in the device shown in FIG. 17.

As shown in FIG. 17, the power-supply-voltage reduction device comprises a voltage reduction circuit 45, and the voltage-reduction-circuit control circuit 46. The voltage reduction circuit 45, which includes the voltage control circuit 5 and the enhancement-type pMOS transistors 3, 4, and 37, is the same circuit as that shown in FIG. 14, except for the fuses 38, 39. In this voltage reduction circuit 45, the gate of the pMOS transistor 37 is not connected to the fuses but to the voltage-reduction-circuit control circuit 46. By a signal from the voltage-reduction-circuit control circuit 46, the pMOS transistor 37 is deactivated for VCC of 5 V, or is activated for VCC of 3.3 V.

Figure 18:
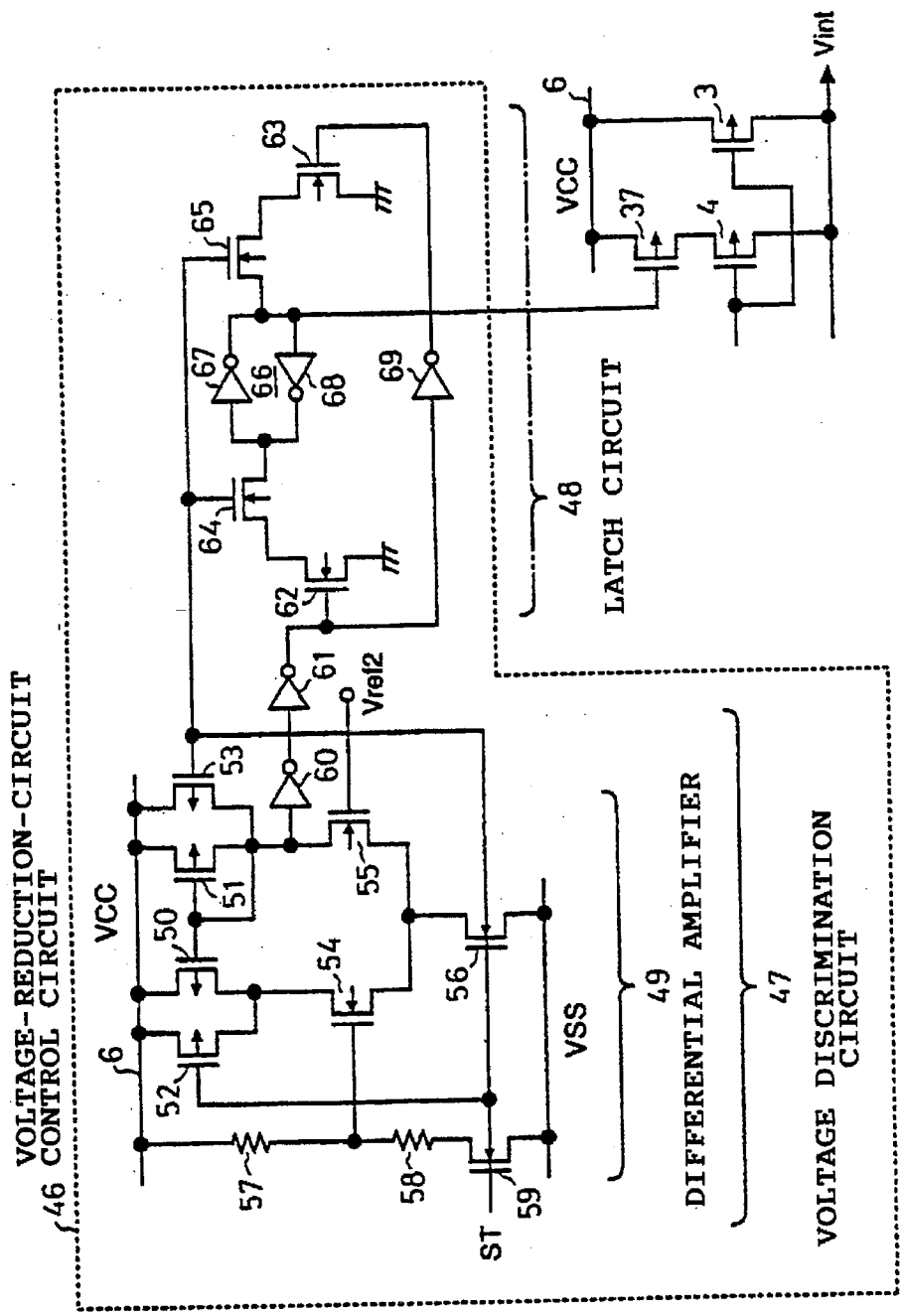
FIG. 18 shows a schematic diagram of a voltage-reduction-circuit control circuit in the device shown in FIG. 17.

As shown in FIG. 18, the voltage-reduction-circuit control circuit 46 comprises a voltage discrimination circuit 47 which discriminates a level of the external power supply voltage VCC and a latch circuit 48 which latches a result of the discrimination in the voltage discrimination circuit 47.

The voltage discrimination circuit 47 includes a differential amplifier 49 which has enhancement-type pMOS transistors 50, 51, 52, 53, enhancement-type nMOS transistors 54, 55, 56. Further, the differential amplifier 49 has resistances 57, 58 which divide the external power supply voltage VCC, an enhancement-type nMOS transistor 59 which controls the dividing operation by the resistances 57, 58, and inverters 60, 61 which invert a logical level of a drain of the nMOS transistor 55.

A reference voltage Vref2 is supplied to a gate of the nMOS transistor 55. In a preferred example, a level of the reference voltage Vref2 may be set to be smaller than a gate voltage level of the nMOS transistor in the case od VCC=4 V, and to be larger than the gate voltage level of the nMOS transistor in the case of VCC=3.6 V.

The latch circuit 48 includes enhancement-type nMOS transistors 62 to 65, an inverter 69, and a flip flop 66 consisting of inverters 67, 68.

Further, a ST signal is a activating signal which activates the nMOS transistors 59, 56 and activates the voltage discrimination circuit 47 to enable the discrimination of the level of the external power supply voltage VCC. The activating signal ST is produced by an activating-signal generation circuit shown in FIG. 19.

Figure 19:
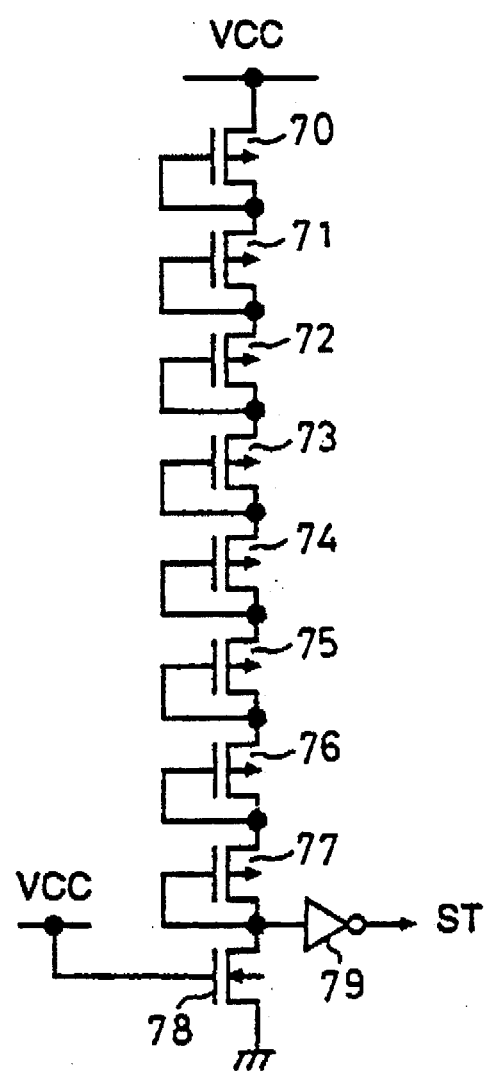
FIG. 19 shows a schematic diagram of an activating-signal generation circuit.

FIG. 19 shows a schematic diagram of the activating-signal generation circuit. This circuit comprises enhancement-type pMOS transistors 70 to 77, an enhancement-type nMOS transistor 78 having a long channel length, and an inverter 79.

In general, when the external power supply voltage VCC is supplied to the power supply line 6, the level of the power supply line 6 is increased from 0 V to the VCC level according to a time constant which is determined by an internal resistance and a capacitance coupled to the power supply line 6. In the activating-signal generation circuit, after the supply of the external power supply voltage VCC, and until the level of the power supply line 6 becomes a level of 8×|VTHP| (VTHP is the threshold level of the pMOS transistor), a drain level of the nMOS transistor 78 is the low level. When the level of the power supply line 6 exceeds the level of 8×|VTHP|, the drain level of the nMOS transistor 78 becomes the high level.

For example, if the |VTHP| is 0.5 V, until the power supply line 6 becomes 8×0.5=4 V, the drain level of the nMOS transistor 78 is the low level, and the activating signal ST is the high level.

And when the level of the power supply line 6 exceeds 8×0.5=4 V, the drain level of the nMOS transistor 78 becomes the high level, and the activating signal becomes the low level.

Figure 20:
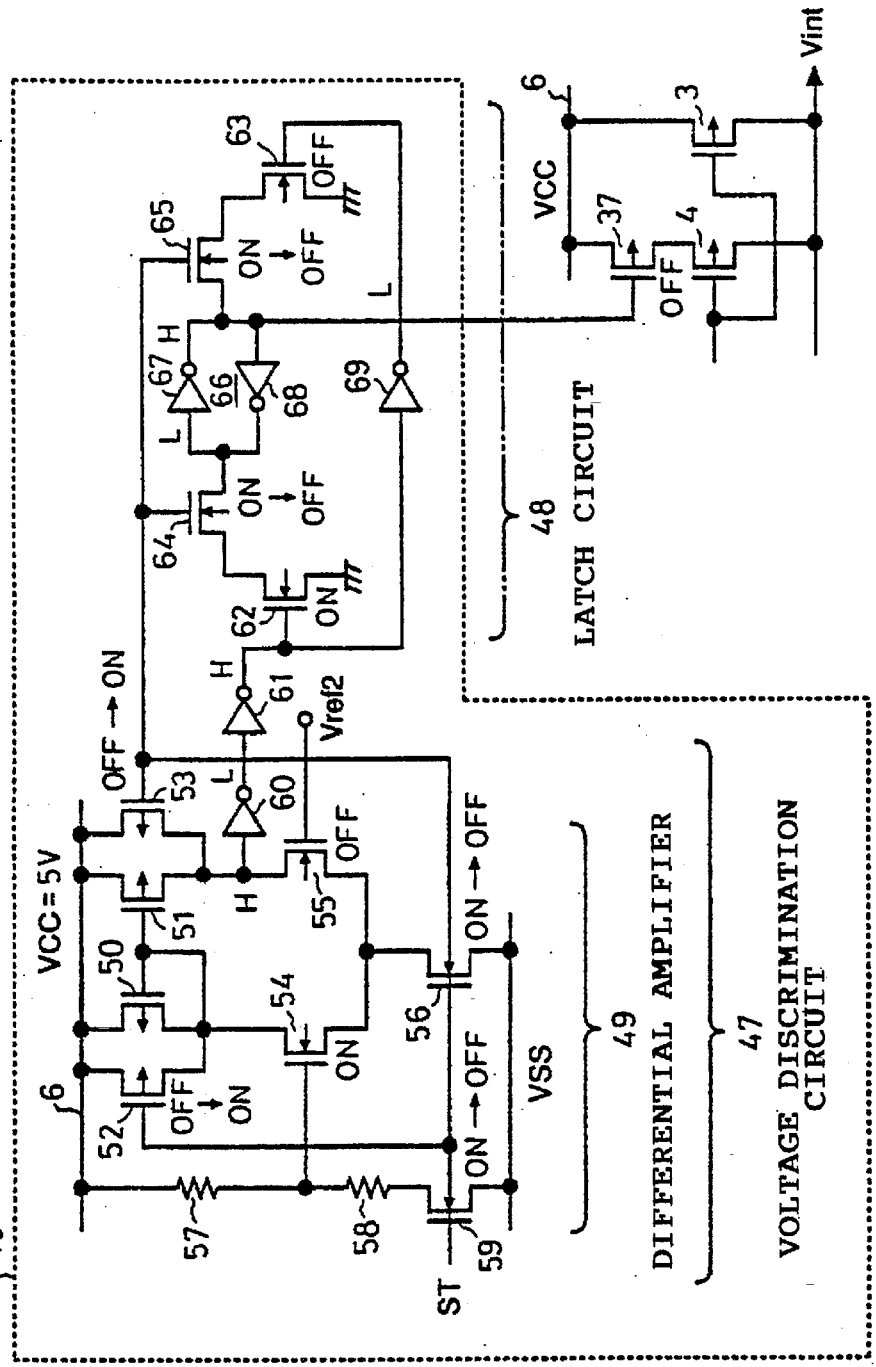
FIGS. 20, 21 show schematic diagrams for explaining an operation of a voltage-reduction-circuit control circuit 46 shown in FIG. 18 for VCCs of 5 V and 3.3 V, respectively.
Figure 21:
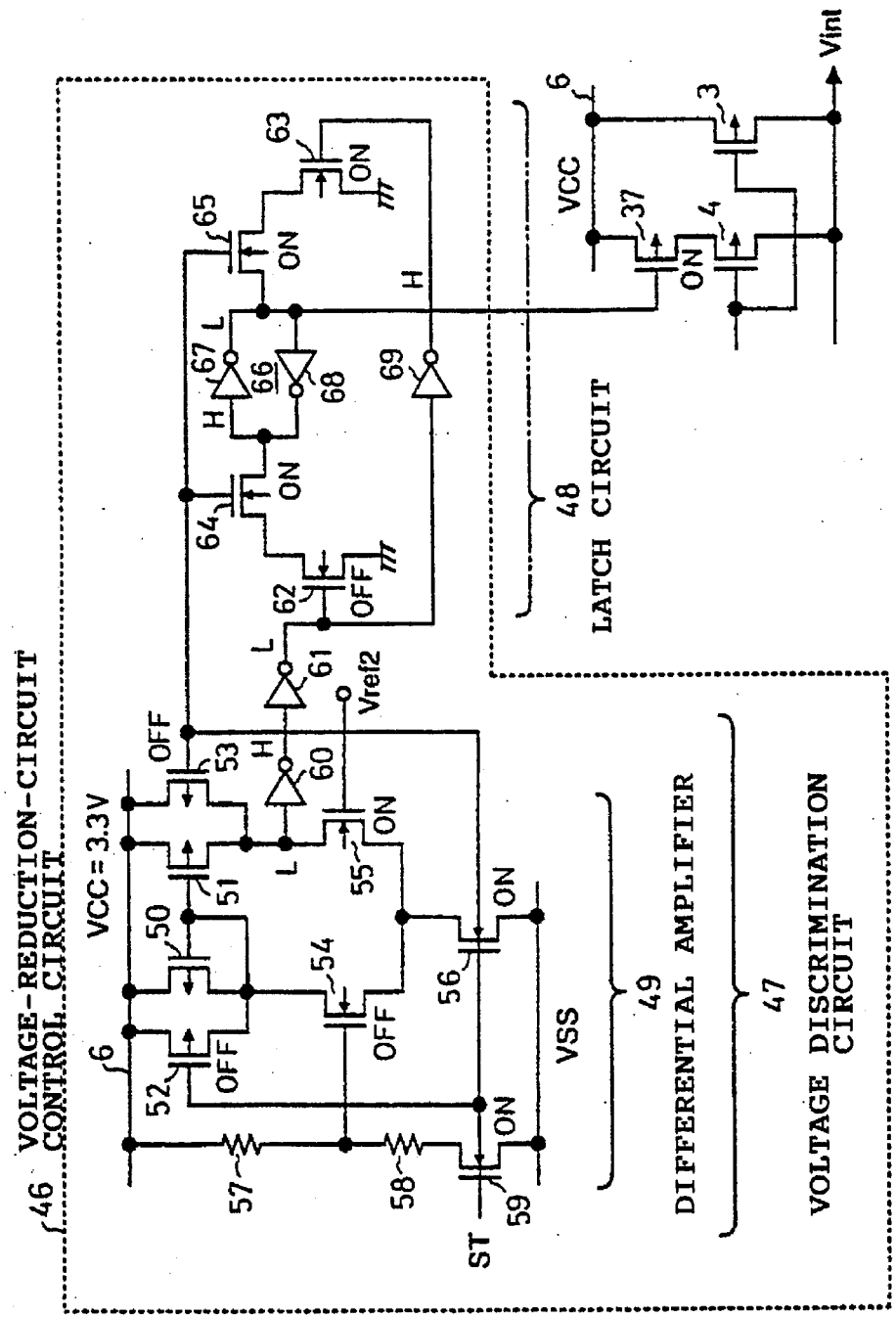

Next, a description will be given of an operation of the voltage-reduction-circuit control circuit 46 shown in FIG. 18, by referring to FIGS. 20, 21. FIGS. 20, 21 show schematic diagrams for explaining the operation of the voltage-reduction-circuit control circuit 46 for VCCs of 5 V and 3.3 V, respectively.

As shown in FIG. 20, when the external power supply voltage VCC which is increasing to 5 V is supplied to the power supply line 6, initially VCC is less than 4 V, so that the activating signal of the high level, which is generated in the activating-signal generation circuit, is applied to the voltage-reduction-circuit control circuit 46. The nMOS transistors 59, 56 are turned on to become conductive, and the pMOS transistors 52, 53 are turned off, so that the differential amplifier 49 and a voltage division circuit consisting of the resistances 57, 58 are activated, and the nMOS transistors 64, 65 are turned on.

And subsequently, when a gate level of the nMOS transistor 54, which is determined by dividing the external power supply voltage VCC, exceeds the reference voltage Vref2 (for example, current VCC is 4 V), the nMOS transistor 54 is turned on and the nMOS transistor 55 is turned off.

As a result, a drain voltage of the nMOS transistor 55 becomes the high level, an output of the inverter 60 becomes the low level, an output of the inverter 61 becomes the high level, and an output of the inverter 69 becomes the low level. Therefore, the nMOS transistor 62 is turned on, the nMOS transistor 63 is turned off, an input of the inverter 67 becomes the low level, and an output of the inverter 67 becomes the high level.

And further, when the level of the power supply line 6 exceeds a threshold (4 V) in the circuit shown in FIG. 19, the activating signal ST becomes the low level. As a result, the nMOS transistors 59, 56 are turned off, and the pMOS transistors 52, 53 are turned on, so that the differential amplifier 49 and the voltage division circuit consisting of the resistances 57, 58 are deactivated. And the nMOS transistors 64, 65 are turned off. Thus the low level in the input port of the inverter 67 and the high level in the output port thereof are maintained.

Therefore, in the voltage reduction circuit 45, the pMOS transistor 37 is turned off, so that only the pMOS transistor 3 is activated.

On the other hand, as shown in FIG. 21, when the external power supply voltage VCC of 3.3 V is supplied to the power supply line 6, the gate level of the nMOS transistor 54, which is determined by dividing the external power supply voltage VCC, does not exceed the reference voltage Vref2 (3.6 to 4 V), so that the nMOS transistor 54 is turned off and the nMOS transistor 55 is turned on.

As a result, the drain voltage of the nMOS transistor 55 becomes the low level, the output of the inverter 60 becomes the high level, the output of the inverter 61 becomes the low level, and the output of the inverter 69 becomes the high level. Therefore, the nMOS transistor 62 is turned off, the nMOS transistor 63 is turned on, the input of the inverter 67 becomes the high level, and the output of the inverter 67 becomes the low level.

Therefore, in the voltage reduction circuit 45, the pMOS transistor 37 is turned on, so that the pMOS transistors 3, 4 are activated.

In this way, the power-supply-voltage reduction device automatically selects the number of transistors necessary for the sufficient current supply according to the level of the external power supply voltage VCC. Spedifically, when the lower external power supply voltage VCC is supplied to this device, the plurality of transistors are activated. Therefore, regardless of the level of the external power supply voltage, this power-supply-voltage reduction device may produce the sufficient current supply ability to achieve the stable operating speed and the stable reduced supply voltage. And this device applicable for the plurality of external power supply voltages also enables a reduction of a production cost as compared to that of the plurality of devices.

Further, if the channel construction of the pMOS transistor 3 is associated with that of the pMOS transistor 4 by the given relationship (for example, the channel width $W_4$ of the pMOS transistor 4 is 7.8 times the channel width $W_3$ of the pMOS transistor 3), the 3.3-V device may have the substantially same current supply ability as the 5-V device.

In the above description of the first embodiment, the activating-signal generation circuit is installed for generating the activating signal. However, it is also possible to supply a control signal from the outside for controlling the nMOS transistors 59, 56, 64, 65, and the pMOS transistors 52, 53 without such an activating-signal generation circuit. In the case of supplying the control signal from the outside, it is desired that the control signal is the high level when the external power supply voltage is being increased to the high value of VCC, and becomes the low level after the high value of VCC is obtained. Such a manner of the control signal enables a reduction of a power consumption of the voltage discrimination circuit 47.

Figure 22:
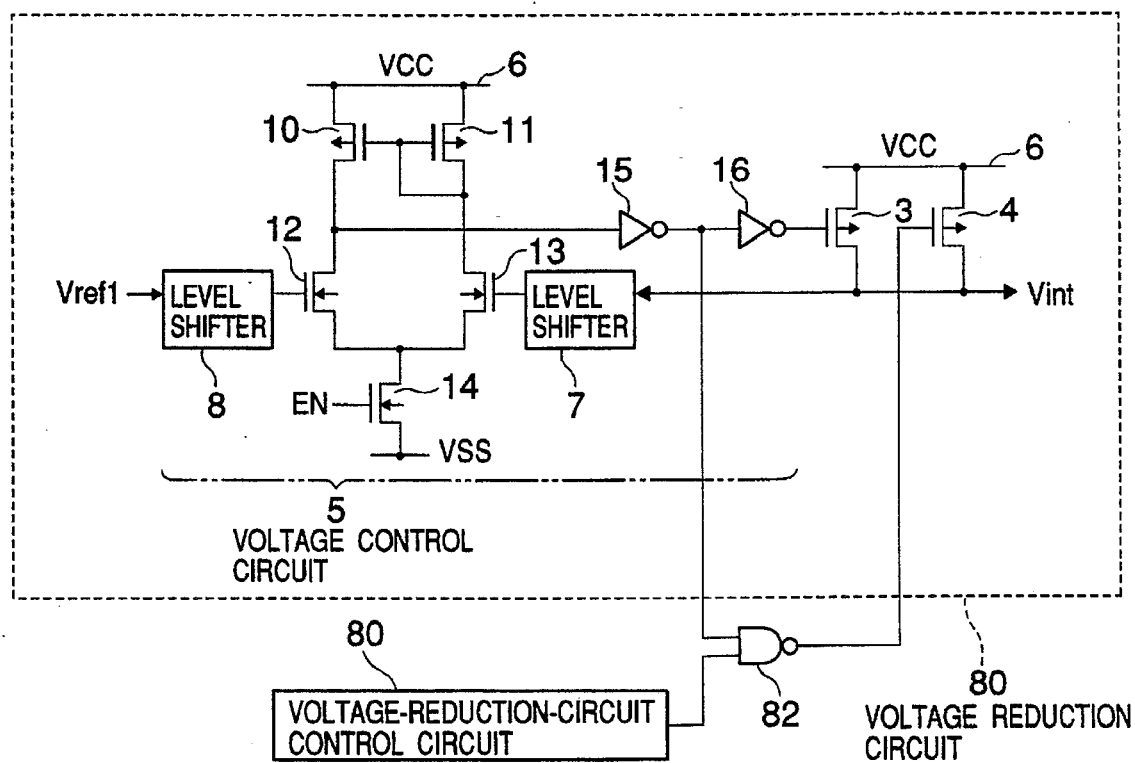
FIG. 22 shows a schematic diagram of a second embodiment of the power-supply-voltage reduction device for the automatic selection according to the present invention.

Next, a description will be given of a second embodiment of the power-supply-voltage reduction device for automatic selection according to the present invention, by referring to FIGS. 22, 23. FIG. 22 shows a schematic diagram of the second embodiment of the power-supply-voltage reduction device for the automatic selection according to the present invention. And FIG. 23 shows a schematic diagram of a voltage-reduction-circuit control circuit in the device shown in FIG. 22.

As shown in FIG. 22, the power-supply-voltage reduction device comprises a voltage reduction circuit 80 and a voltage-reduction-circuit control circuit 81. The voltage reduction circuit 80, which includes the voltage control circuit 5 and the enhancement type pMOS transistors 3, 4, is the same circuit as that shown in FIG. 15A.

The voltage-reduction-circuit control circuit 81 discriminates the level of the external power supply voltage VCC supplied to the power supply line 6. And when VCC is 5 V, the control circuit 81 controls a NAND circuit 82 to produce a given voltage to deactivate the pMOS transistor 4, and when the VCC is 3.3 V, the control circuit 81 controls the NAND 82 to operate as the inverter to activate the pMOS transistor 4.

Figure 23:
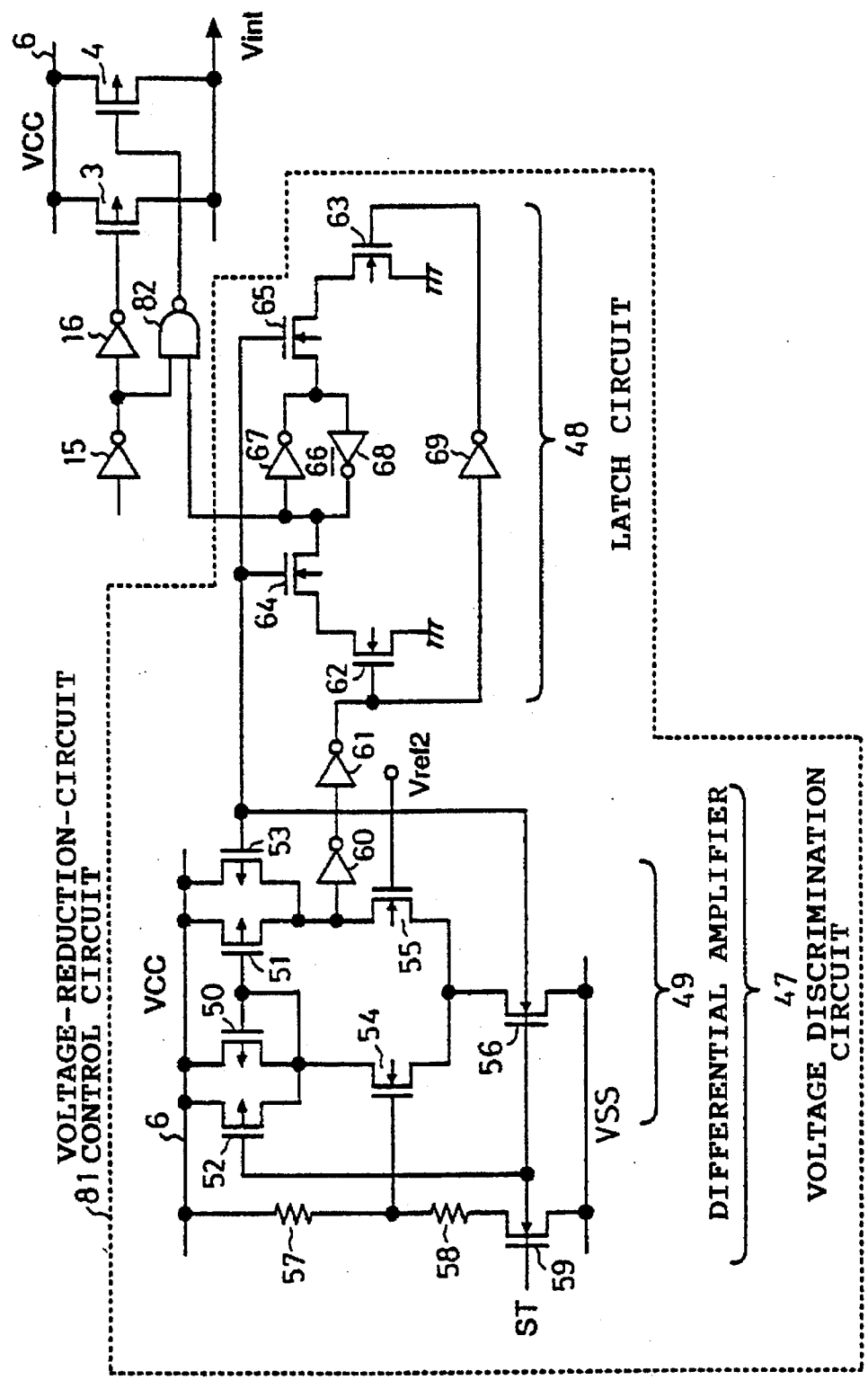
FIG. 23 shows a schematic diagram of a voltage-reduction-circuit control circuit in the device shown in FIG. 22.

As shown in FIG. 23, the voltage-reduction-circuit control circuit 81 comprises a voltage discrimination circuit 47 which discriminates the level of the external power supply voltage VCC and the latch circuit 48 which latches the result of the discrimination in the voltage discrimination circuit 47, which are the same circuits shown in FIG. 18. However, in this circuit 81, an input port of the inverter 67 is connected to an input port of the NAND circuit 82.

Figure 24:
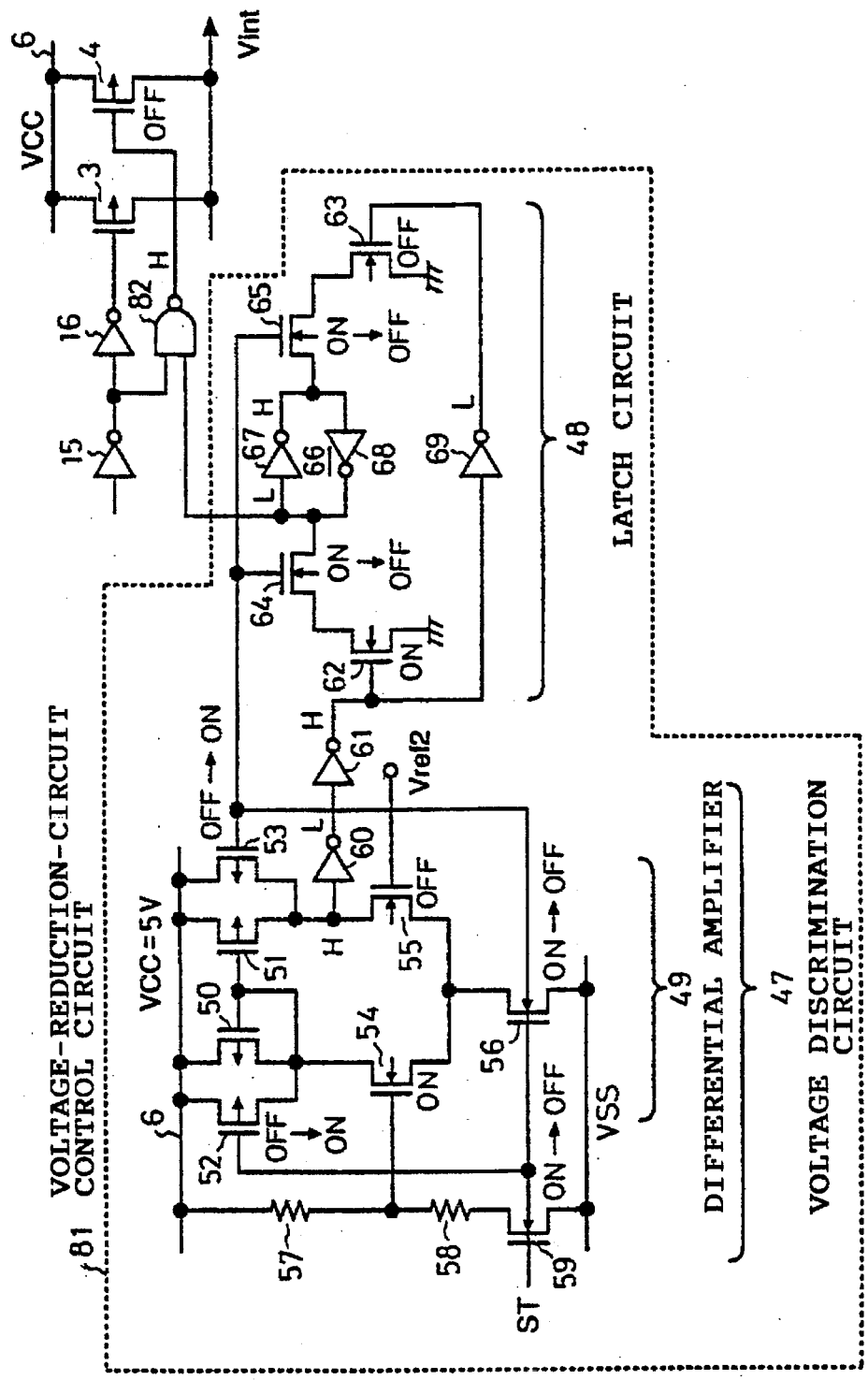
FIGS. 24, 25 show schematic diagrams for explaining an operation of the voltage-reduction-circuit control circuit 81 shown in FIG. 23 for VCCs of 5 V and 3.3 V, respectively.
Figure 25:
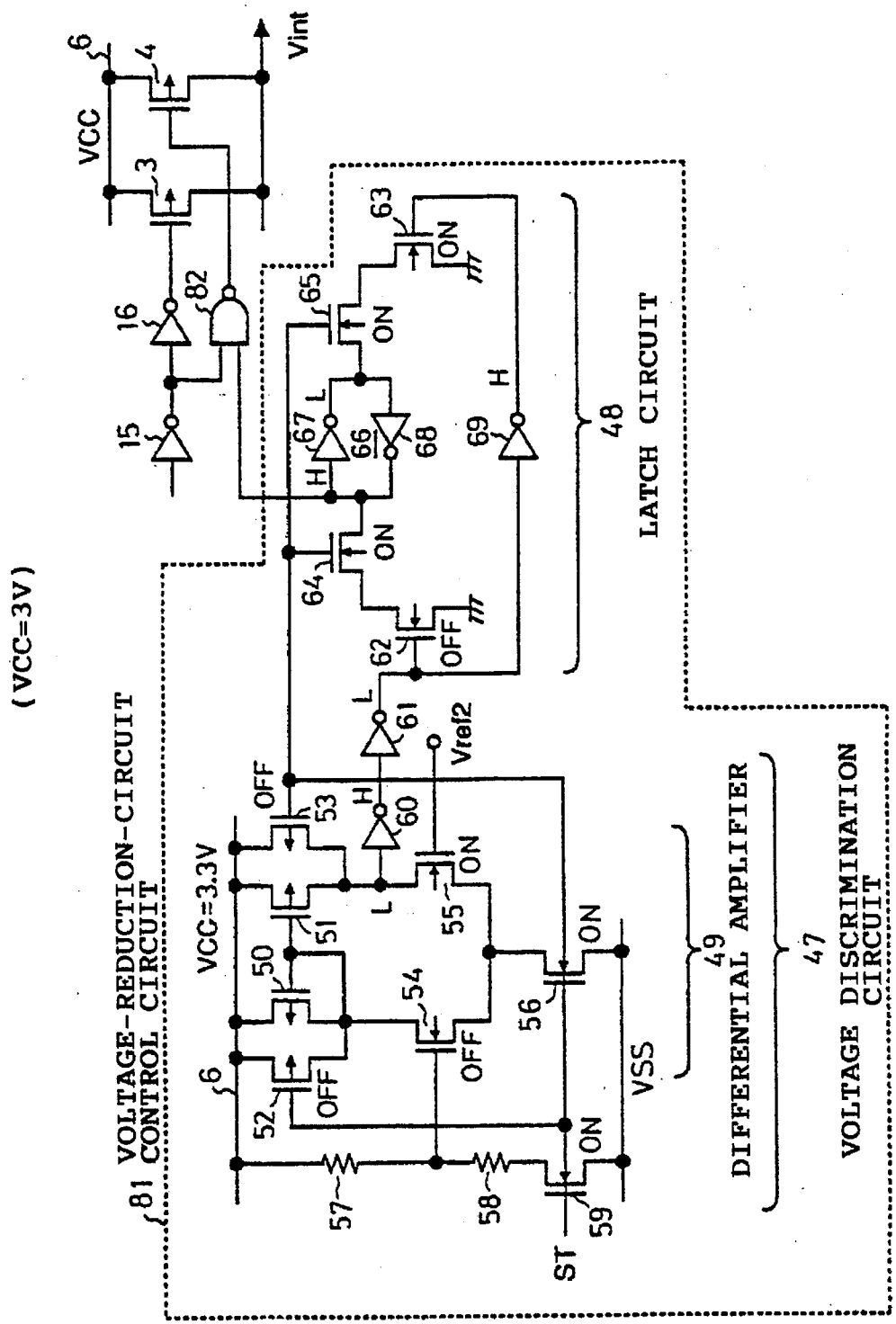

Next, a description will be given of an operation of the power-supply-voltage reduction device shown in FIGS. 22, 23, by referring to FIGS. 24, 25. FIGS. 24, 25 show schematic diagrams for explaining the operation of the voltage-reduction-circuit control circuit 81 for VCCs of 5 V and 3.3 V, respectively.

As shown in FIG. 24, when the external power supply voltage VCC which is increasing to 5 V is supplied to the power supply line 6, initially VCC is less than 4 V, so that the activating signal of the high level, which is generated in the activating-signal generation circuit, is applied to the voltage-reduction-circuit control circuit 81. And, the nMOS transistors 59, 56 are turned on to become conductive, and the pMOS transistors 52, 53 are turned off, so that the differential amplifier 49 and the voltage division circuit consisting of the resistances 57, 58 are activated, and the nMOS transistors 64, 65 are turned on.

And subsequently, when the gate level of the nMOS transistor 54, which is determined by dividing the external power supply voltage VCC, exceeds the reference voltage Vref2 (for example, current VCC is 4 V), the nMOS transistor 54 is turned on and the nMOS transistor 55 is turned off.

As a result, the drain voltage of the nMOS transistor 55 becomes the high level, the output of the inverter 60 becomes the low level, the output of the inverter 61 becomes the high level, and the output of the inverter 69 becomes the low level. Therefore, the nMOS transistor 62 is turned on, the nMOS transistor 63 is turned off, the input of the inverter 67 becomes the low level, and the output of the inverter 67 becomes the high level.

And further, when the level of the power supply line 6 exceeds a threshold (4 V) in the circuit shown in FIG. 19, the activating signal ST becomes the low level. As a result, the nMOS transistors 59, 56 are turned off, and the pMOS transistors 52, 53 are turned on, so that the differential amplifier 49 and the voltage division circuit consisting of the resistances 57, 58 are deactivated. And the nMOS transistors 64, 65 are turned off, thus the low level in the input port of the inverter 67 and the high level in the output port thereof are maintained.

Therefore, in the voltage reduction circuit 81, the output of the NAND circuit 82 becomes the high level and the pMOS transistor 4 is turned off, so that only the pMOS transistor 3 is activated as the regulator transistor.

On the other hand, as shown in FIG. 25, when the external power supply voltage VCC of 3.3 V is supplied to the power supply line 6, the gate level of the nMOS transistor 54, which is determined by dividing the external power supply voltage VCC, does not exceed the reference voltage Vref2 (3.6 to 4 V), so that the nMOS transistor 54 is turned off and the nMOS transistor 55 is turned on.

As a result, the drain voltage of the nMOS transistor 55 becomes the low level, the output of the inverter 60 becomes the high level, the output of the inverter 61 becomes the low level, and the output of the inverter 69 becomes the high level. Therefore, the nMOS transistor 62 is turned off, the nMOS transistor 63 is turned on, the input of the inverter 67 becomes the high level, and the output of the inverter 67 becomes the low level.

Therefore, in the voltage reduction circuit 81, the NAND circuit 82 is operative as the inverter against the output of the inverter 15, so that the pMOS transistors 3, 4 are activated as the regulator transistors.

In this way, the power-supply-voltage reduction device automatically selects the number of transistors necessary for the sufficient current supply according to the level of the external power supply voltage VCC. Specifically, when the lower external power supply voltage VCC is supplied to this device, the plurality of transistors are activated. Therefore, regardless of the level of the external power supply voltage, this power-supply-voltage reduction device may produce the sufficient current supply ability to achieve the stable operating speed and the stable reduced supply voltage. And this device applicable for the plurality of external power supply voltages also enables a reduction of a production cost as compared to that of the plurality of devices.

Further, if the channel construction of the pMOS transistor 3 is associated with that of the pMOS transistor 4 by the given relationship (for example, the channel width $W_4$ of the pMOS transistor 4 is 7.8 times of the channel width $W_3$ of the pMOS transistor 3), the 3.3-V device may have the substantially same current supply ability as the 5-V device.

Figure 26:
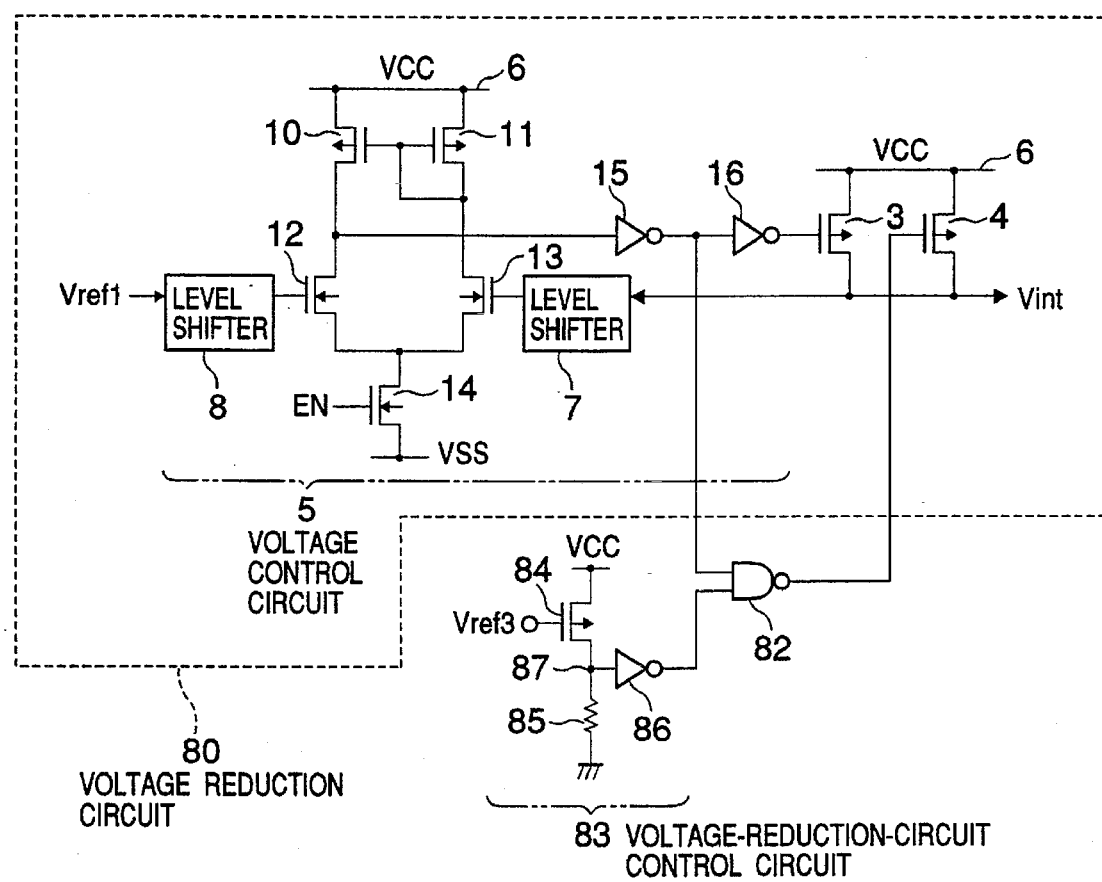
FIG. 26 shows a schematic diagram of a third embodiment of the power-supply-voltage reduction device for the automatic selection according to the present invention.

Next, a description will be given of a third embodiment of the power-supply-voltage reduction device for automatic selection according to the present invention, by referring to FIG. 26. FIG. 26 shows a schematic diagram of the third embodiment of the power-supply-voltage reduction device for the automatic selection according to the present invention.

As shown in FIG. 26, the power-supply-voltage reduction device comprises the voltage reduction circuit 80 which is the same circuit shown in FIG. 22, and a voltage-reduction-circuit control circuit 83. The voltage reduction circuit 80 includes the voltage control circuit 5 and the enhancement-type pMOS transistors 3, 4.

The voltage-reduction-circuit control circuit 83 discriminates the level of the external power supply voltage VCC supplied to the power supply line 6. And when the VCC is 5 V, the control circuit 83 controls a NAND circuit 82 to produce a given voltage to deactivate the pMOS transistor 4, and when the VCC is 3.3 V, the control circuit 81 controls the NAND 82 to operate as the inverter to activate the pMOS transistor 4.

The voltage-reduction-circuit control circuit 83 comprises an enhancement-type pMOS transistor 84, a gate of which is supplied with a reference voltage Vref3, a resistance 85 and an inverter 86. The pMOS transistor 84 connects an input node 87 of the inverter 86 to the power supply line 6, and the resistance 85 connects the input node 87 of the inverter 86 to the ground. And an output of the inverter 86 is supplied to an input of the NAND circuit 82.

Since a margin of ±10% is taken into account in each VCC of 3 to 3.3 V and 5 V, to allow that activation/deactivation of the pMOS transistor 4 is changeable in a VCC range of 3.6 to 4.5 V, the reference voltage Vref 3 is set to a larger level than 3.6–|VTHP|, and to a smaller level than 4.5–|VTHP|.

Figure 27:
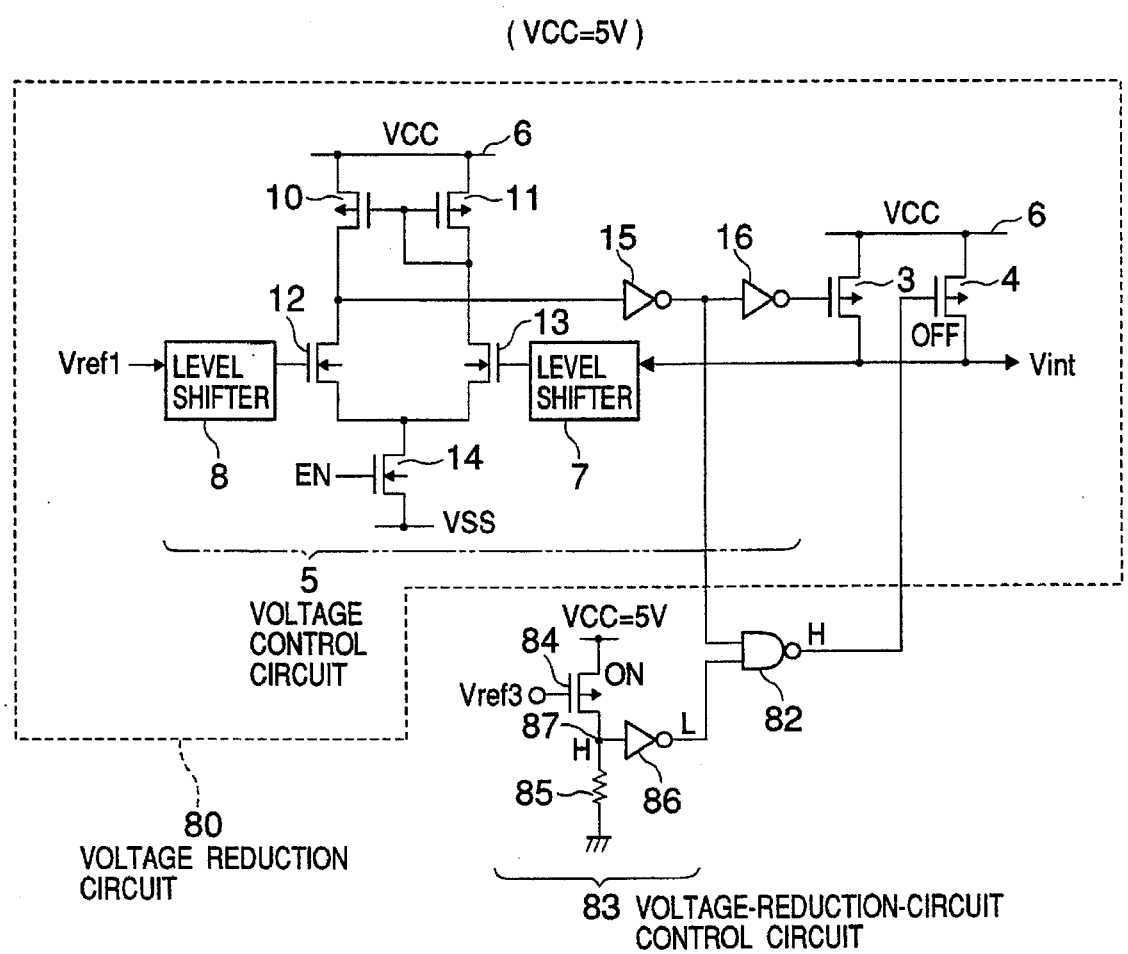
FIGS. 27, 28 show schematic diagrams for explaining an operation of the voltage-reduction-circuit control circuit 81 shown in FIG. 26 for VCCs of 5 V and 3.3 V, respectively.
Figure 28:
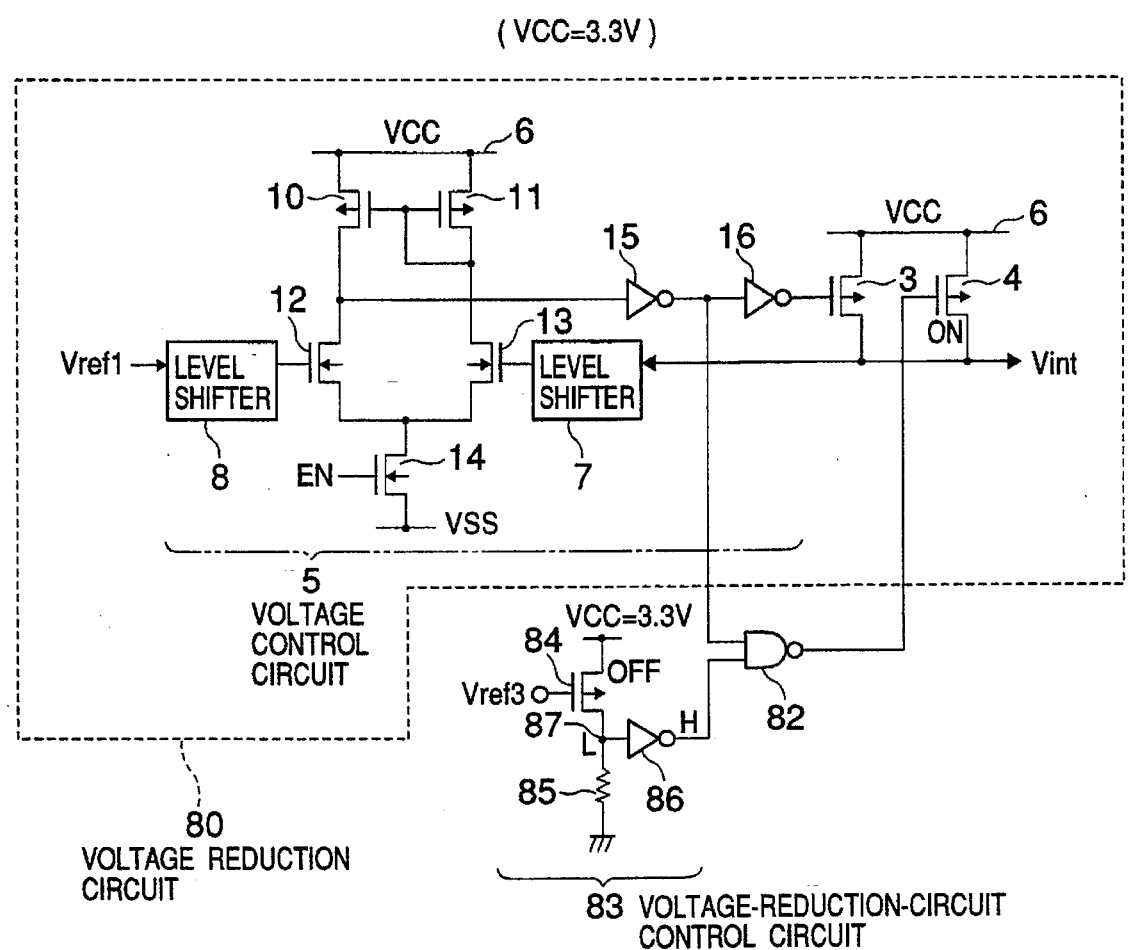

Next, a description will be given of an operation of the power-supply-voltage reduction device shown in FIG. 26, by referring to FIGS. 27, 28. FIGS. 27, 28 show schematic diagrams for explaining the operation of the voltage-reduction-circuit control circuit 81 for VCCs of 5 V and 3.3 V, respectively.

As shown in FIG. 27, when the external power supply voltage VCC of 5 V is supplied to the power supply line 6, the pMOS transistor 84 is turned on, the node 87 becomes the high level, and the output of the inverter 86 becomes the low level, so that the output of the NAND circuit 82 becomes the high level. Therefore, the pMOS transistor 4 is deactivated and only the pMOS transistor 3 is operative as the regulator transistor.

On the other hand, as shown in FIG. 28, when the external power supply voltage VCC of 3.3 V is supplied to the power supply line 6, the pMOS transistor 84 is turned off, the node 87 becomes the low level, and the output of the inverter 86 becomes the high level, so that the output of the NAND circuit 82 is operative as the inverter against the output of the inverter 15. Therefore, the pMOS transistors 3, 4 are operative as the regulator transistors.

In this way, the power-supply-voltage reduction device automatically selects the number of transistors necessary for the sufficient current supply according to the level of the external power supply voltage VCC. Specifically, when the lower external power supply voltage VCC is supplied to this device, the plurality of transistors are activated. Therefore, regardless of the level of the external power supply voltage, this power-supply-voltage reduction device may produce the sufficient current supply ability to achieve the stable operating speed and the stable reduced supply voltage. And this device applicable for the plurality of external power supply voltages also enables a reduction of a production cost as compared to that of the plurality of devices.

Further, if the channel construction of the pMOS transistor 3 is associated with that of the pMOS transistor 4 by the given relationship (for example, the channel width $W_4$ of the pMOS transistor 4 is 7.8 times the channel width $W_3$ of the pMOS transistor 3), the 3.3-V device may have the substantially same current supply ability as the 5-V device.

In addition, because construction of the voltage-reduction-circuit control circuit 83 in the third embodiment is very simple as compared to that of the voltage-reduction-circuit control circuit 81 in the second embodiment, the power-supply-voltage reduction device of the third embodiment has advantages of small size and low cost.

Finally, a description will be given of semiconductor integrated circuits including the power-supply-voltage reduction device according to the present invention. The devices which have been described by referring to FIGS. 3 to 28 are applicable to the semiconductor integrated circuits.

Figure 29:
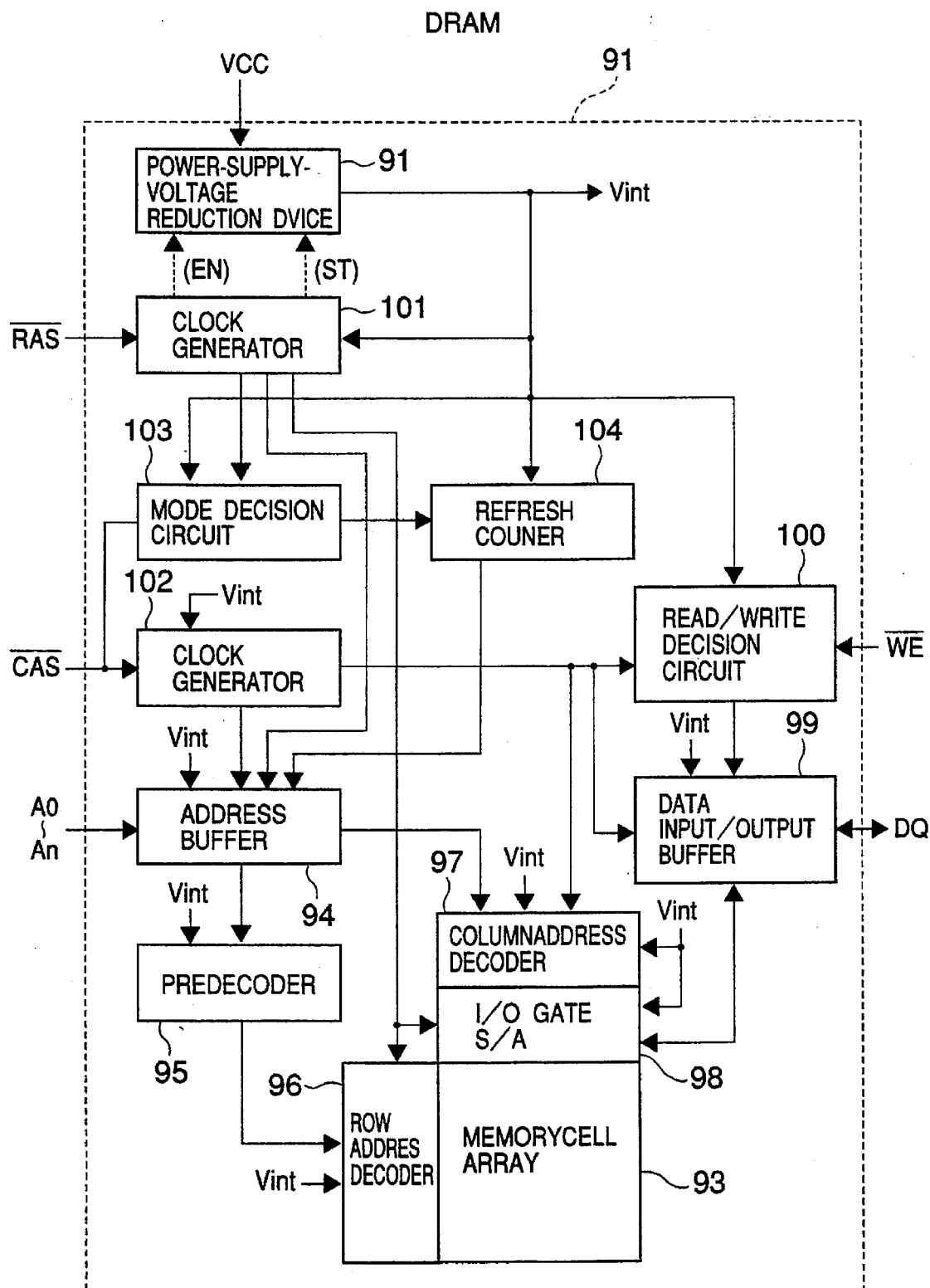
FIG. 29 shows a block diagram of an embodiment of a DRAM including the power-supply-voltage reduction device according to the present invention.

FIG. 29 shows a block diagram of an embodiment of a DRAM including the power-supply-voltage reduction device according to the present invention. The DRAM 91 includes a power-supply-voltage reduction device 92. The device 92 may be one of the power-supply-voltage reduction devices fabricated by any of the embodiments of the selective fabrication method described above, and any of the power-supply-voltage reduction devices of any of the embodiments described above. In the DRAM 91 shown in FIG. 29, a single power-supply-voltage reduction device 92 is represented, but in fact, there are two power-supply-voltage reduction devices, in which one is used when the DRAM is in an activation mode, the other is used when the DRAM is in a standby mode.

As shown in FIG. 29, the DRAM 91 comprises a memory cell array 93 being arranged with memory cells, an address buffer 94 receiving an address signal, a predecoder 95 predecoding a row address signal stored in the address buffer 94, and a row address decoder 96 decoding a predecode signal produced from the predecoder 95 and selecting a word line.

Further, the DRAM 91 includes a column address decoder 97 which decodes a column address signal stored in the address buffer 94 and produces a column selection signal for selecting a column.

In the DRAM 91, a block 98 comprises an I/O gate which selects the column based on the column selection signal produced from the column address decoder 97, and a sense amplifier (S/A) which amplifies a data read out from the memory cell array 93.

A data input/output buffer 99 latches an output data and an input data, and a read/write decision circuit 100 controls the data input/output buffer 99 based on a writing control signal ($\overline{WE}$) supplied from the outside.

A clock generator 101 receives a row address strobe signal ($\overline{RAS}$) and produces a clock signal for controlling the address buffer 94, and the row address decoder 96, etc.

A clock generator 102 receives a column address strobe signal (CAS) and produces a clock signal for controlling the address buffer 94, and the column address decoder 97, etc.

A mode decision circuit 103 decides a refresh mode based on the clock signal and the column address strobe signal (CAS), and a refresh counter 104 produces an address necessary for the refresh mode.

The clock generator 101 is constructed such that the differential-amplifier activating signal EN is supplied to the power-supply-voltage reduction device 92. Specifically, if either of the power-supply-voltage reduction devices shown in FIGS. 18, 23 is used as the device 92, the clock generator 101 includes the activating-signal generation circuit shown in FIG. 19 to supply the activating signal ST to the device 92.

As described above, the present inventions have the following features.

According to the fabrication method of the power-supply-voltage reduction device, the steps of forming the plurality of transistors and forming the voltage control circuit are common to a variety of voltage reduction devices with different external power supply voltages. And only in the step of forming the transistor control circuit, an activation/deactivation of the transistors are controlled to form the voltage reduction device for each external power supply voltage.

Therefore, such an activation/deactivation in the transistor control circuit makes it possible to selectively fabricate the voltage reduction device for a specific external power supply voltage. Further, since the voltage reduction device is constructed with a plurality of transistors for a low external power supply voltage, this voltage reduction device may have the sufficient current supply ability to achieve the stable operating speed and the stable reduced supply voltage.

And when the plurality of transistors includes the first and the second transistors, if a channel construction of the first transistor is associated with that of the second transistor by the given relationship, a combination of the first and the second transistors with the external power supply voltage of the second voltage level less than the first voltage level may have the substantially same current supply ability as the first transistor with the external power supply voltage of the first voltage level.

According to the power-supply-voltage reduction device, in the transistor control circuit, the activation/deactivation of the transistors reducing the external power supply voltage is controlled by the user, and in the voltage-reduction-circuit control circuit, the activation/deactivation of the transistors is automatically controlled according to the voltage level of the external power supply voltage. In such control operations, a large number of transistors are activated to produce a large current supply for the low external power supply voltage. On the other hand, for a high external power supply voltage, a small number of transistors are activated because of producing the sufficient current supply.

Therefore, the power-supply-voltage reduction device is applicable for a variety of systems with different external power supply voltages, and is capable of producing the sufficient current supply ability for any external power supply voltage. Thus, this substantial current supply ability enables the power-supply-voltage reduction device to achieve the stable operating speed and the stable reduced supply voltage.

And the semiconductor integrated circuit including such the power-supply-voltage reduction device, is applicable for semiconductor integrated systems with different power supply voltages.

Further, the present invention is not limited to these embodiments, but various variations and modifications may be made without departing from the scope of the present invention.

What is claimed is:

1. A fabrication method for producing an electronic device including a power-supply-voltage reduction device arranged based on an external power supply voltage comprising the steps of:

(a) forming a plurality of transistors having first current electrodes supplied with the external power supply voltage, control electrodes receiving a control signal, and second current electrodes which are connected together to an output port, the second current electrodes producing a reduced power supply voltage which is generated from said external power supply voltage according to said control signal, at said output port;

(b) forming a voltage control circuit generating said control signal based on a comparison of said reduced power supply voltage and a reference voltage and controlling at least one of said plurality of transistors for maintaining the reduced power supply voltage substantially to a level of the reference voltage; and (c) forming a transistor control circuit for activating at least one of said plurality of transistors according to a level of said external power supply voltage supplied to a power supply line.

2. The method as claimed in claim 1, wherein the step (c), when forming a first transistor and a second transistor in the step (a), forms said transistor control circuit, for activating said first transistor and to deactivate said second transistor whenever said external power supply voltage of a first voltage level is supplied to the power supply line, or so as to activate both the first and second transistors whenever the external power supply voltage of a second voltage level less than the first voltage level is supplied thereto.

3. The method as claimed in claim 2, wherein said step (c) comprises the step of:

(c-1) connecting said first current electrode of the first transistor to said power supply line whenever said external power supply voltage of the first voltage level is supplied to the power supply line, or connecting said first current electrodes of the first and the second transistors to said power supply line whenever said external power supply voltage of the second voltage level is supplied thereto.

4. The method as claimed in claim 3, wherein:

said fabrication method is one of fabrication procedures of a semiconductor integrated circuit; and said step (c-1) forms said power supply line by using one of different mask patterns for selectively forming the power supply line.

5. The method as claimed in claim 2, wherein said step (c) comprises the steps of:

(c-2-1) connecting directly said first current electrode of the first transistor to said power supply line;

(c-2-2) forming a fuse connecting said first current electrode of the second transistor to said power supply line;

(c-2-3) disconnecting said fuse whenever said external power supply voltage of the first voltage level is supplied to the power supply line.

6. The method as claimed in claim 2, wherein said step (c) comprises the steps of:

(c-3-1) connecting directly said first current electrode of the first transistor to said power supply line;

(c-3-2) forming a third transistor having a first current electrode connected to said power supply line, a control electrode, and a second current electrode connected to said first current electrode of the second transistor;

(c-3-3) forming a first fuse connecting said control electrode of the third transistor to said power supply line;

(c-3-4) forming a second fuse connecting said control electrode of the third transistor to a ground; and (c-3-5) disconnecting said second fuse whenever said external power supply voltage of the first voltage level is supplied to said power supply line, or disconnecting said first fuse whenever said external power supply voltage of the second voltage level is supplied thereto.

7. The method as claimed in claim 2, wherein said step (c) comprises the steps of:

(c-4-1) connecting said first electrodes of the first and the second transistors to said power supply line; and (c-4-2) supplying a given voltage instead of said control signal to said control electrode of the second transistor for making the second transistor in an unconductive condition whenever said external power supply voltage of the first voltage level is supplied to said power supply line, and supplying said control signal to said control electrodes of the first and the second transistors whenever said external power supply voltage of the second voltage level is supplied thereto.

8. The method as claimed in claim 2, wherein the step (a) forms said first transistor and said second transistor such that a current supply ability flowing through said output port, when the external power supply voltage of the first voltage level is connected to said power supply line, is substantially identical to that when the external power supply voltage of the second voltage level is connected thereto, by means of relating a channel width and a channel length of said first transistor with those of said second transistor.

9. A power-supply-voltage reduction device including a voltage reduction circuit, said power-supply-voltage reduction device comprising:

a plurality of transistors having first current electrodes supplied with an external power supply voltage, control electrodes receiving a control signal, and second current electrodes which are connected together to an output port, the second current electrodes producing a reduced power supply voltage which is generated from said external power supply voltage according to said control signal, at said output port; and a voltage control circuit generating said control signal based on a comparison of said reduced power supply voltage and a reference voltage, and controlling at least one of said plurality of transistors for maintaining the reduced power supply voltage substantially to a level of the reference voltage.

10. The power-supply-voltage reduction device as claimed in claim 9, further comprising a transistor control circuit for activating at least one of said plurality of transistors by a user according to a level of said external power supply voltage supplied to a power supply line.

11. The power-supply-voltage reduction device as claimed in claim 10, wherein:

said plurality of transistors includes a first transistor and a second transistor; and said transistor control circuit is controlled by a user to activate only said first transistor or to activate both said first transistor and said second transistor.

12. The power-supply-voltage reduction device as claimed in claim 11, wherein:

said first current electrode of the first transistor is directly connected to said power supply line; and said transistor control circuit includes a fuse, which is disconnectable by the user, connecting said first current electrode of the second transistor to said power supply line.

13. The power-supply-voltage reduction device as claimed in claim 11, wherein:

said first current electrode of the first transistor is directly connected to said power supply line; and said transistor control circuit includes:

a third transistor having a first current electrode connected to said power supply line, a control electrode, and a second current electrode connected to said first current electrode of the second transistor;

a first fuse, which is disconnectable by the user, connecting said control electrode of the third transistor to said power supply line;

a second fuse, which is disconnectable by the user, connecting said control electrode of the third transistor to a ground.

14. The power-supply-voltage reduction device as claimed in claim 11, wherein:

said first current electrodes of the first and the second transistors are directly connected to said power supply line; and said transistor control circuit includes a selection circuit selecting, by indicating from the user, said control signal from said voltage control circuit or a given voltage for deactivating said second transistor to supply to the control electrode of the second transistor.

15. The power-supply-voltage reduction device as claimed in claim 11, wherein:

said first current electrode of the first transistor is directly connected to said power supply line; and said transistor control circuit includes a third transistor having a first current electrode connected to said power supply line, a control electrode to which the user supplies a given voltage to turn off the third transistor to make it unconductive, and a second current electrode connected to said first current electrode of the second transistor.

16. The power-supply-voltage reduction device as claimed in claim 9, comprising a voltage-reduction-circuit control circuit discriminating a voltage level of said external power supply voltage which is supplied to a power supply line, and controlling said voltage reduction circuit to activate an associated number of the transistors according to the voltage level of the external power supply voltage.

17. The power-supply-voltage reduction device as claimed in claim 16, wherein:

said plurality of transistors includes a first transistor and a second transistor having first current electrodes directly connected to said power supply line; and said voltage-reduction-circuit control circuit includes a selection circuit selecting said control signal from said voltage control circuit or a given voltage for deactivating said second transistor to supply to a control electrode of the second transistor, wherein said voltage-reduction-circuit control circuit controls the voltage reduction circuit, when said external power supply voltage of a first voltage level is connected to said power supply line, to activate said first transistor and to deactivate said second transistor by said selection circuit selecting said given voltage, and when said external power supply voltage of a second voltage level less than the first voltage level is connected to said power supply line, for activating both the first and the second transistors by said selection circuit selecting said control signal.

18. The power-supply-voltage reduction device as claimed in claim 16, wherein:

said plurality of transistors includes a first transistor having a first current electrode directly connected to said power supply line, and a second transistor; and said voltage-reduction-circuit control circuit includes a third transistor having a first current electrode connected to said power supply line, a control electrode, and a second current electrode connected to said first current electrode of the second transistor, wherein said voltage-reduction-circuit control circuit controls the voltage reduction circuit, when said external power supply voltage of a first voltage level is connected to said power supply line, for activating said first transistor and to deactivate said second transistor by turning off said third transistor to make it unconductive, and when said external power supply voltage of a second voltage level less than the first voltage level is connected to said power supply line, for activating both the first and the second transistors by turning on said third transistor to make it conductive.

19. The power-supply-voltage reduction device as claimed in claim 16, wherein said first transistor and said second transistor are constructed such that a current supply ability flowing through said output port, when the external power supply voltage of the first voltage level is connected to said power supply line, could be substantially identical to that when the external power supply voltage of the second voltage level is connected thereto, by means of relating a channel width and a channel length of said first transistor with those of said second transistor.

20. A semiconductor integrated circuit device comprising:
a voltage reduction circuit including:
a plurality of transistors having first current electrodes supplied with an external power supply voltage, control electrodes receiving a control signal, and second current electrodes which are connected together to an output port, the second current electrodes producing a reduced power supply voltage which is generated from said external power supply voltage according to said control signal, at said output port; and a voltage control circuit generating said control signal based on a comparison of said reduced power supply voltage and a reference voltage, and controlling at least one of said plurality of transistors for maintaining the reduced power supply voltage substantially to a level of the reference voltage;

a transistor control circuit so as to activate at least one of said plurality of transistors by a user according to a level of said external power supply voltage supplied to a power supply line; and an internal circuit to which said reduced power supply voltage is supplied as an internal power supply voltage.

21. A semiconductor integrated circuit device comprising:
a voltage reduction circuit including:
a plurality of transistors having first current electrodes supplied with an external power supply voltage, control electrodes receiving a control signal, and second current electrodes which are connected together to an output port, the second current electrodes producing a reduced power supply voltage which is generated from said external power supply voltage according to said control signal, at said output port; and a voltage control circuit generating said control signal based on a comparison of said reduced power supply voltage and a reference voltage, and controlling at least one of said plurality of transistors for maintaining the reduced power supply voltage substantially to a level of the reference voltage;

a voltage-reduction-circuit control circuit discriminating a voltage level of said external power supply voltage which is supplied to a power supply line, and controlling said voltage reduction circuit for activating an associated number of the transistors according to the voltage level of the external power supply voltage; and an internal circuit to which said reduced power supply voltage is supplied as an internal power supply voltage.

* * * * *